United States Patent [19]

Okamoto

[11] Patent Number: 5,521,033

[45] Date of Patent: May 28, 1996

[54] PROCESS FOR MANUFACTURING SEMICONDUCTOR INTEGRATED CIRCUIT DEVICE, EXPOSURE METHOD AND MASK FOR THE PROCESS

[75] Inventor: Yoshihiko Okamoto, Ohme, Japan

[73] Assignee: Hitachi, Ltd., Tokyo, Japan

[21] Appl. No.: 397,355

[22] Filed: Mar. 2, 1995

Related U.S. Application Data

[63] Continuation of Ser. No. 897,455, Jun. 10, 1992, Pat. No. 5,418,092.

[30] Foreign Application Priority Data

Jun. 10, 1991 [JP] Japan ..................................... 3-137511

[51] Int. Cl.$^6$ ........................................................ G03F 9/00
[52] U.S. Cl. ............................ 430/5; 430/311; 430/313; 430/314; 430/319
[58] Field of Search ................................ 430/5, 311, 313, 430/314, 319

[56] References Cited

U.S. PATENT DOCUMENTS

| | | |
|---|---|---|
| 5,045,417 | 9/1991 | Okamoto . |
| 5,248,575 | 9/1993 | Ogashi . |
| 5,418,092 | 5/1995 | Okamoto ..................................... 430/5 |

FOREIGN PATENT DOCUMENTS

| | | |
|---|---|---|
| 58-1737442 | 12/1983 | Japan . |
| 62-675514 | 3/1987 | Japan . |
| 6468071 | 3/1990 | Japan . |
| 403156458 | 7/1991 | Japan . |

*Primary Examiner*—S. Rosasco
*Attorney, Agent, or Firm*—Antonelli, Terry, Stout & Kraus

[57] ABSTRACT

Herein disclosed is a technology for improving the accuracy of transfer of a circuit pattern in a manufacture process of a semiconductor integrated circuit or the like by solving problems in the manufacture of a phase shifter mask for a phase shift exposure when in the transfer.

Disclosed is an exposure method of improving the transfer accuracy of the circuit pattern in the manufacture process of a semiconductor integrated circuit or the like by exposing the mask having first and second overlapped masks, when an object is to be irradiated with the light having transmitted through the mask, to invert the optical phase of the light having transmitted through a transmissive region of the first mask.

Also disclosed is an exposure method, by which a sample is irradiated with a light having transmitted through a mask formed with a predetermined pattern having a shielding region and a transmissive region, to transfer the pattern of the mask to the sample, wherein the improvement resides: in that the mask includes a first mask and a second mask; in that the first mask is formed with a pattern having a shielding region and a transparent region; in that the second mask is formed with a pattern having a phase shifter for establishing a phase difference in the transmission light; and in that the first mask and the second mask are overlapped on the sample to establish a phase difference in the light having transmitted through the first mask, so that a clear image may be focused on the sample by making use of the interference of the transmission light.

13 Claims, 21 Drawing Sheets

DEPENDENCY ON FOCUSING POSITION

PROCESS FOR MANUFACTURING SEMICONDUCTOR INTEGRATED CIRCUIT DEVICE, EXPOSURE METHOD AND MASK FOR THE PROCESS

This application is a Continuation application of application Ser. No. 07/897,455 filed Jun. 10, 1992 now U.S. Pat. No. 5,418,092.

BACKGROUND OF THE INVENTION

The present invention relates to an exposure technology and, more particularly, to a technology which is effective when applied to a transfer technology for a circuit pattern in a manufacture process for manufacturing a semiconductor integrated circuit or the like.

As the high integration of a semiconductor integrated circuits advances so that the design rules of circuit elements and wiring lines reach the order of sub-microns, the photolithography step of transferring a circuit pattern on a mask to a semiconductor wafer by making use of a light of g- or i-line is accompanied by a serious problem in a reduction of the accuracy of the circuit pattern to be transferred to a wafer. In case, for example, a circuit pattern having transmissive regions P1 and P2 and shielding regions N and 252 formed on a mask 251, as shown in FIG. 13(a), is to be transferred to the wafer, lights which have just been transmitted through the paired transmissive regions P1 and P2 across the shielding region N are in phase, as shown at (b) in the same Figure, so that the two lights interfere with each other at the intrinsic shielding region on the wafer. This serves to intensify each other (as shown at (c) in the same Figure). As a result, the projected image on the wafer has its contrast degraded and its focal depth becomes shallower, as shown at (d) in the same Figure, so that the pattern transfer accuracy is seriously deteriorated.

As a means for solving this problem, there has been proposed a phase shift technology for preventing the drop of the contrast of the projected image by changing the phase of the light to transmit through the mask. In Japanese Patent Laid-Open No. 173744/1983, for example, there is disclosed the phase shift technology which will be referred to as the "Levenson type" or the "complementary phase shift method"), in which one of a pair of transmissive regions across a shielding region is formed with a transparent film so that a phase difference may be established at the time of exposure between the lights which have been transmitted through the two transmissive regions to weaken the interference light at the portion intrinsically forming a shielding region on the wafer. Specifically, one of the paired transparent regions P1 and P2 across the shielding region N (other than the shielding film 254) is formed with a transparent film 255 having a predetermined refractive index, when a circuit pattern formed on a mask 253, as shown in FIG. 14(a), is to be transferred to the wafer. By adjusting the thickness of that transparent film 225, moreover, the lights which have been individually transmitted through the transmissive regions P1 and P2 establish a phase difference of 180 degrees, as shown at (b) in the same Figure, so that they interfere with each other to weak themselves in the shielding region N on the wafer (as shown at (c) in the same Figure). As a result, as shown at (d) in the same Figure, the projected image on the wafer can have its contrast, resolution and focal depth improved to improve the transfer accuracy of the circuit pattern formed on the mask 253.

In Japanese Patent Laid-Open No. 67514/1987, on the other hand, there is disclosed a phase shift technology (which will be referred to as the "sub-shifter type phase shift method"), in which the amplitude distribution of a light having transmitted through a transmissive region of a mask is prevented from extending transversely by removing a portion of the shielding region to form fine opening patterns, by forming a transparent film in one of the opening pattern or the transmissive region existing in the vicinity of the former, and by establishing a phase difference between the light having transmitted through the transmissive region and the light which has been transmitted through the opening pattern.

In Japanese Patent Laid-Open No. 140743/1990, there is disclosed a phase shift technology (which will be referred to as the "edge emphasized type phase shift method"), in which a phase shift boundary portion is emphasized by forming a phase shifter in a portion of the transmissive region of a mask to establish a phase difference in the transmission light.

In Japanese Patent Laid-Open No. 247647/1990, moreover, there is disclosed a technology in which a g- or i-line resist is used as a phase shifter film.

SUMMARY OF THE INVENTION

According to our investigations, the technology (which will be referred to as the "on-mask phase shift method"), in which the transmissive region of the common mask is formed in its portion with the transparent film to establish the phase difference between the light transmitted through the transparent film and the light transmitted through the transmissive region having no transparent film, as in those examples of the prior art, is accompanied by a problem that it takes a long time and much labor to manufacture a mask for establishing the phase difference.

Specifically, an actual mask formed with an integrated circuit pattern is not allowed to have sticking foreign substances and defects and thus to exert serious restrictions on the manufacture of the mask which is arranged with the transparent film for establishing the phase difference.

An object of the present invention is to provide a phase shift exposure technology capable of solving the aforementioned problems.

Specifically, one object of the present invention is to provide a phase shift exposure technology capable of manufacturing a mask easily.

Another object of the present invention is to provide a phase shift exposure technology capable of inspecting a mask easily.

Another object of the present invention is to provide a phase shift exposure technology suited for exposure of a fine pattern of sub-microns.

Another object of the present invention is to provide a mask positioning technology suited for the phase shift exposure technology.

Another object of the present invention is to provide a mask manufacturing technology suited for the phase shift exposure technology.

The foregoing and other objects and novel features of the present invention will become apparent from the following description to be made with reference to the accompanying drawings.

The representative examples of the invention to be disclosed herein will be briefly described in the following discussion.

According to one aspect of the present invention, there is disclosed a method of exposing first and second masks of a mask overlapped when a sample is to be irradiated with a light transmitted through a transmissive region of the mask which is formed with a pattern having a shielding region and the transmissive region, so that a clear image may be focused on the sample by establishing an optical phase difference through the second mask in the light transmitted through the transmissive region of the first mask, to make use of the interference of the corresponding transmission light. In addition, foreign substances on the first mask and the second mask are prevented from being transferred, by overlapping the principal surfaces of the first and second masks in proximity to each other and by fixing and integrating them in the peripheral portion of a mask substrate.

Specifically, the exposure system of the present invention is prepared with the mask of the phase shift pattern especially for preventing the drop of the contrast of the projected image by changing the phase of the mask for the pattern transfer and the phase of the light in connection with the change in the phase of the light transmitted through the mask so that the mask formed with a semiconductor integrated circuit pattern may be less frequently encountered by the sticking foreign substances and the defects to reduce the restrictions on the mask manufacture.

The phase shift method, in which two masks are opposed in proximity to each other so that they may be used as if they were a single mask, will be called the "closely opposed mask phase shift method".

When the sample is exposed to the light which has been transmitted through the mask, the mask is divided into a first mask and a second mask so that the first mask formed with the pattern having the shielding region and the transmissive region and the second mask formed with the phase shift pattern are overlapped and exposed. Thus, it is possible to reduce the problems of pattern defects and foreign substances caused in the mask manufacture.

The corresponding transmission light is enabled to interfere thereby to focus a clear image on the illuminated object by establishing the optical phase difference through the second mask in the light having transmitted through the transmissive region of the first mask.

In addition, the first mask and the second mask have their principal surfaces overlapped in proximity to each other so that the foreign substances on the principal surfaces of the first and second masks may not be transferred. Specifically, the first and second masks have their principal surfaces locally positioned by the transparent substrates thereof so that foreign substances stuck to the backs of the individual transparent substrates can be defocused and prevented from being transferred to the wafer surface.

DETAILED DESCRIPTION OF THE INVENTION

Figure 1:
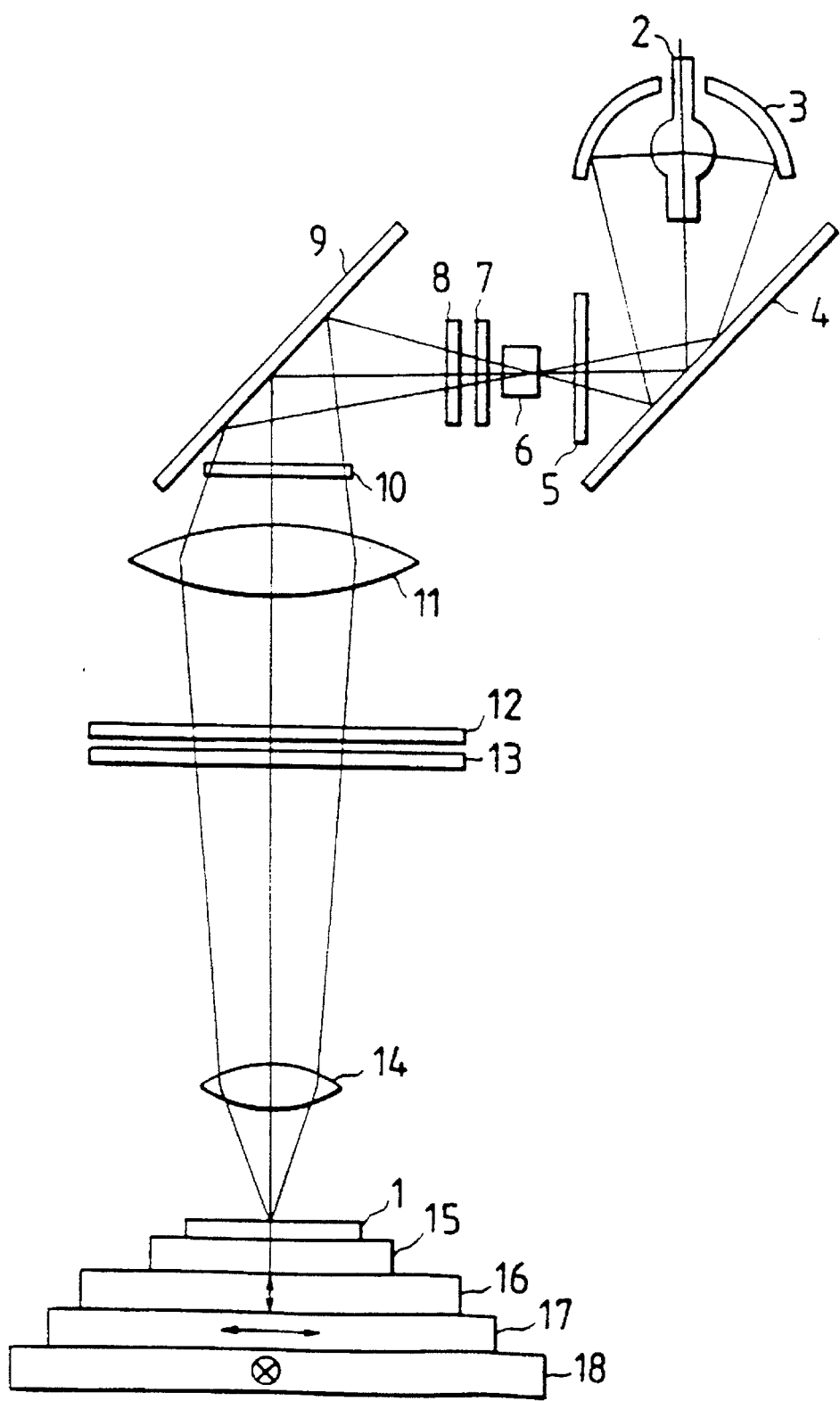
FIG. 1 is an explanatory diagram showing an exposure system according to one embodiment of the present invention.
Figure 2A:
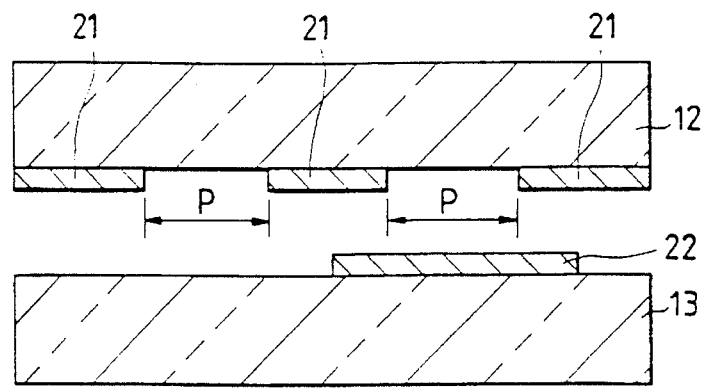
FIG. 2 is an explanatory diagram showing one embodiment of the mask of the present invention.
Figure 2B:
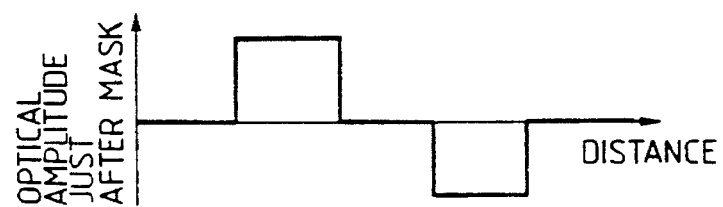
Figure 2C:
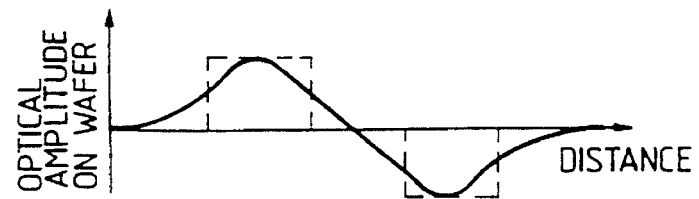
Figure 2D:
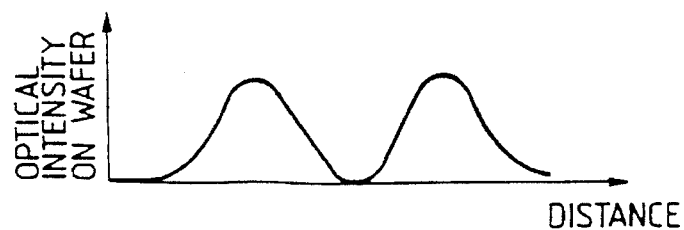

The present invention will be described in the following in connection with its specific examples. For convenience of description, the specific examples will be described as divided embodiments, which are not separate but modifications relating to each other or which form part of another embodiment. In the individual Figures, moreover, identical or similar parts are designated with identical reference numerals.

(1) Embodiment 1

FIG. 1 is an explanatory diagram showing a mask pattern exposure system according to one embodiment of the present invention. The same Figure shows exposure means for irradiating a sample with light transmitted through a mask which is formed with a predetermined pattern having a shielding region and a transmissive region. A lens type step-and-repeat type i-line 5:1 reduction projector applicable to the exposure is exemplified by the i-line stepper NRS-1755i7A (wherein NA=0.5, and the exposure area=17.5 mm square) of NIKON. This can be applied to the practice of the present invention by changing the size of the mask holder.

In the same Figure: reference numeral 1 designates a semiconductor wafer to be treated, such as a single crystal Si wafer of 5 to 8 inches; numeral 2 a high-pressure mercury lamp acting as an exposure light source; numeral 3 a condenser mirror; numeral 4 a first reflecting plane mirror; numeral 5 a shutter; numeral 6 a fly-eye lens; numeral 7 an aperture for adjusting a coherence factor σ (σ=0.5 in the present embodiment); numeral 8 a shortcut filter for cutting the far ultraviolet side having a shorter wavelength than the i-line (of 365 nm); numeral 9 a second reflecting plane mirror; numeral 10 a mask blind for determining the range of transfer region; numeral 11 a condenser lens for the Koehler illumination; numeral 12 a first or main mask forming an essential portion of the present invention; numeral 13 a second or auxiliary mask likewise forming an essential portion of the present invention; and numeral 14 a reduction projecting lens generally including a number of lens groups. In the stepper thus exemplified, the aforementioned wafer side is made telecentric. Incidentally, the mask side can be made telecentric. This case is advantageous because no magnification error occurs even if a small gap is left between the individual pattern faces on the first and second masks. Reference numeral 15 designates a wafer adsorption bed; numeral 16 a Z-axis carriage (in vertical directions); numeral 17 an X-axis carriage (in horizontal transverse directions); and numeral 18 a Y-axis carriage (in horizontally longitudinal directions) for constituting an X-Y stage together with the aforementioned X-axis carriage 17. The mask of the same Figure is formed to include a first mask and a second mask. The first mask is formed with a pattern having a shielding region and a transmissive region similar to those of the mask of the prior art. The second mask is formed with a pattern having a phase shifter for establishing a phase difference in the transmission light in accordance with the characteristics of the present invention. In the present embodiment, the first mask and the second mask are orderly arranged on an optical path from the light source to the sample surface. Moreover, the first mask and the second mask have their principal surfaces closely overlapped in face-to-face relation. Thanks to this arrangement, the phase difference can be established in light transmitted through the desired transmissive region of the first mask pattern. Moreover, the pattern of a clear mask pattern can be focused on the sample surface. The first and second masks thus far described can be inverted in their order of arrangement on the optical path extending from the light source and the sample surface. Specifically, the phase difference can be established in the transmission light of the first mask by establishing the phase difference in the transmission light by the second mask and by irradiating the first mask with the light having the phase difference. Like before, the clear image of the mask pattern can also be focused on the sample surface by making use of the interference of the transmission light.

Next, examples of the structures of the individual patterns of the first mask and the second mask will be specifically described in the following.

FIG. 2 is an explanatory section showing the masks of the embodiment of the present invention and the pattern exposure light. The same Figure presents at (a) the sections of the first and second masks for transferring a pattern. At (a) of the same Figure: the reference numeral 12 designates the main mask substrate which is made of a plate (which has an area of 5 inches square, a thickness of 4.8 mm and an exposure region of 17.5 mm square, as converted over the wafer) of synthetic quartz; numeral 13 the auxiliary mask substrate made of similar synthetic quartz; numeral 21 a shielding Cr film; and numeral 22 a phase shifter film.

The first mask shown at (a) in FIG. 2 is a reticle which is formed, in the process for forming a semiconductor manufacture system, with an original having a size of five times as large as the exact size of an integrated circuit pattern for transferring a predetermined integrated circuit pattern to the wafer. The transparent mask substrate for forming the mask is made of synthetic quartz glass having a refractive index of 1.47, for example, and is laminated by forming its principal face formed thereon with a shielding film of a metal layer of Cr or the like in a pattern of a predetermined shape.

Next, the method of forming the aforementioned mask will be briefly described in the following.

The aforementioned first mask is prepared by polishing and rinsing the surface of the synthetic quartz plate and by subsequently depositing a Cr film of about 0.05 to 0.3 μm, for example, all over the surface of the principal face of the quartz plate, followed by applying an electron beam sensitive resist having a thickness of 0.1 to 0.8 μm, for example, to the whole surface of the Cr film. Next, a desired integrated circuit pattern is worked by making use of the electron beam exposure technology. This electron beam exposure technology uses an electron beam to form a fine resist pattern over the sample, as will be described in the following.

The sample thus having the aforementioned electron beam sensitive resist applied thereto is irradiated with an electron beam by making use of an electron beam drawing apparatus. This electron beam drawing apparatus irradiates the sample or mask substrate at its designated position and shape with the electron beam in accordance with the pattern data which are registers with the positional coordinates and shape of the integrated circuit pattern. In case the aforementioned resist is positive, the exposed portion is removed with a predetermined developing liquid, and the exposed metal film is etched by the wet etching method or the like to form a pattern of a predetermined shape. In case the aforementioned resist is negative, the unexposed portion is etched off with a predetermined developing liquid to form a pattern of a predetermined shape. Also, the resist is removed with a resist peeling liquid and is rinsed. Thus, there are formed a shielding region and a transmissive region of predetermined shapes.

The second mask, as shown at (a) in FIG. 2, is formed, over a synthetic quartz substrate similar to the aforementioned one, with a pattern which has a phase shifter for shifting the phase of the transmission light. The aforementioned phase shifter is a thin film made of SOG (Spin On Glass) or indium oxide ($InO_x$) for designating the thickness of a transparent material which is determined by the refractive index of the transparent material and the wavelength of the transmission light. The SOG is rotationally applied to the aforementioned quartz substrate and is then baked at a high temperature to deposit the transparent thin film. At this time, in order to invert the phase, the following relation has to be satisfied:

$$d=\lambda/2(n-1),$$

wherein: the transparent film has a thickness d; the transmission light has a wavelength λ; and the transparent film has a refractive index n. If the wavelength λ of the light used in the exposure is 0.365 μm (of the i-line) and if the refractive index n of the transparent film is 1.5, for example, the thickness of the transparent film may be about 0.87 μm. Considering the dispersion (Of 80 Angstroms, i.e., about 2% of the shifter thickness even in the best state) when the shifter is formed, the phase inversion has to admit a phase difference of about π/20 to π/10. In this Specification, therefore, the phrases "phase inversion", "π or equivalent"

and "180 degrees or equivalent" include those differences, unless otherwise explicitly specified.

In a transparent substrate having a transparent thin film of specified thickness deposited thereon, the transparent film processing of necessary portions is carried out by making use of the electron beam exposure technology like before. In order to invert the phase, the second mask is baked at a high temperature after an SOG or the like has been applied to the shielding film of the glass substrate. At this time, the transparent film can be given the aforementioned thickness by controlling the r.p.m. of the aforementioned mask substrate while the SOG is being applied.

Incidentally, in case the electron beam exposure technology is to be used, an antistatic layer made of aluminum having a thickness of 0.05 μm, for example, is formed by the sputtering method over the resist applied face. Next, the electron beam drawing is carried out on the basis of the phase shifter working pattern data corresponding to the pattern of the aforementioned integrated circuit. In case, at this time, the first mask and the second mask are to be overlapped in face-to-face relation, as described above, the pattern data of the first mask and the pattern data of the second mask are positioned in a relation of mirror symmetry so that the aforementioned electron beam drawing is accomplished by inverting the coordinate system in the apparatus. This pattern drawing of mirror symmetry is incorporated as a standard function into the electron beam drawing system now commercially available so that it can be easily effected.

Figure 3:
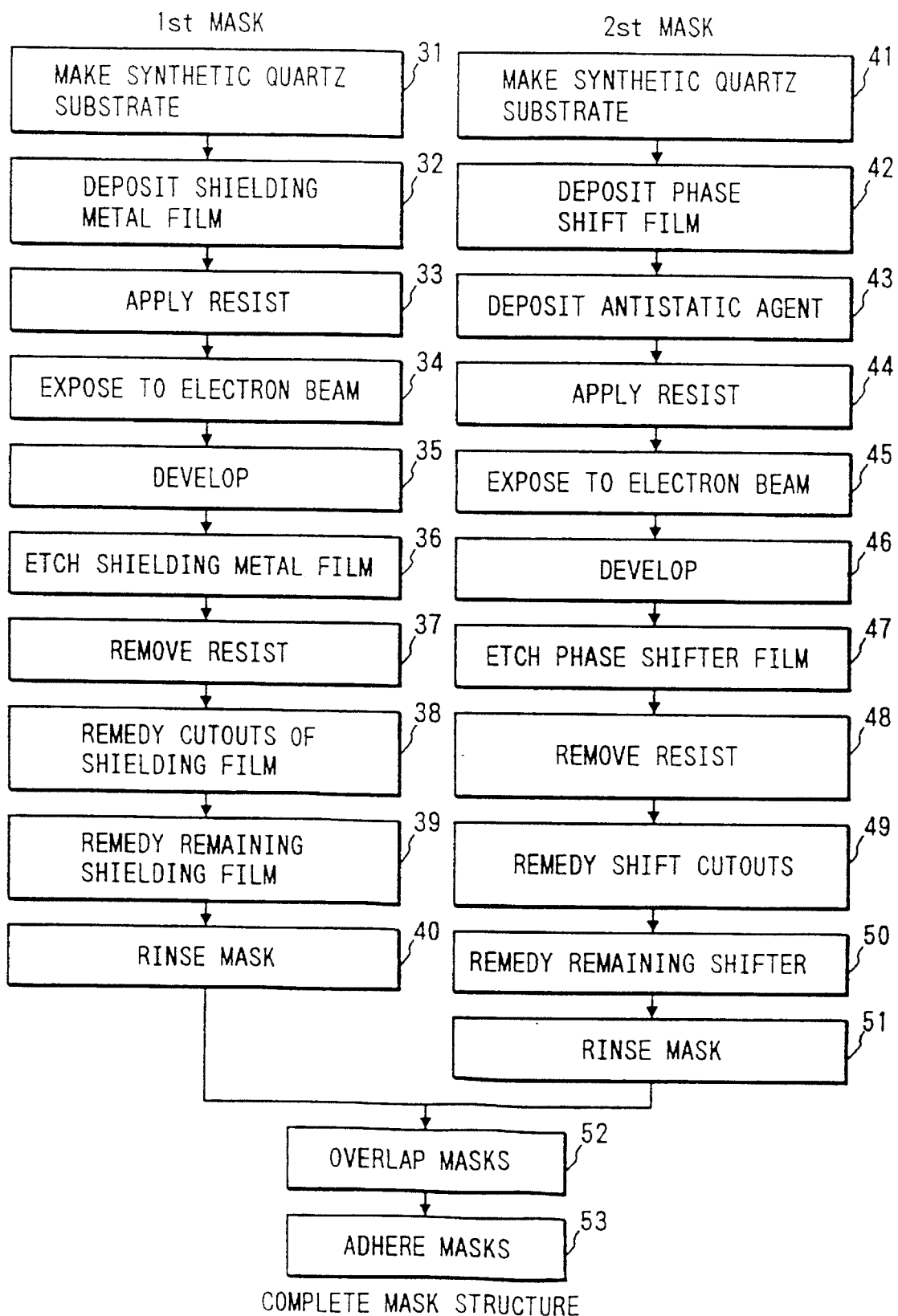
FIG. 3 is an explanatory chart showing a flow for forming a mask of the present invention.

FIG. 3 shows a flow chart for forming the aforementioned mask. As shown in the same Figure, the first mask and the second mask can be prepared as independent different masks until midway of the manufacturing flow. In the same Figure: reference numeral 31 designates a step of making a synthetic quartz substrate of the first or main mask; numeral 32 a step of depositing a shielding metal film for covering substantially all over one principal surface of the aforementioned substrate 31 with a Cr film; numeral 38 a resist applying step of spin-applying a photoresist to the aforementioned chrome film; numeral 34 an electron beam exposure step of exposing the aforementioned resist film to an electron beam by the direct drawing with an electron beam exposure apparatus; numeral 35 a resist developing step of forming a desired resist pattern by removing the unnecessary portion of the aforementioned resist; numeral 36 a shielding metal film etching step of etching the aforementioned chrome film by using the aforementioned resist pattern as the mask; numeral 87 a resist removing step of removing the aforementioned resist thereafter all over the surface; numeral 38 a shielding film defect remedy step or a shielding film cutout remedy step of remedying the cutouts of the aforementioned shielding film; numeral 39 designates a remaining shielding film remedy step of removing the remaining portion of the unnecessary shielding film of the aforementioned substrate; and numeral 40 a first mask rinsing step of rinsing the first mask once completed. In the same Figure: reference numeral 41 designates a step of making a synthetic quartz substrate for the second or auxiliary mask; numeral 42 a step of depositing a phase shifter film for covering substantially all over the surface of the aforementioned exposure region with a phase shifter film; numeral 43 a step of depositing an antistatic film for covering the aforementioned phase shifter film with a thin conductive film; numeral 44 a resist applying step of spin-applying a register film for patterning the aforementioned phase shifter film; numeral 45 an electron beam exposure step of drawing the aforementioned resist directly like before with an electron beam; numeral 46 a resist developing step of forming a resist pattern by removing the unnecessary portion of the aforementioned resist film; numeral 47 a step of etching the aforementioned phase shifter film for forming the phase shifter film into a desired pattern by using the aforementioned resist film as the mask; numeral 48 a resist removing step of subsequently removing the aforementioned resist film; numeral 49 a shifter defect remedy step or a shifter cutout remedy step of remedying the cutouts of the shifter on the aforementioned patterned substrate; numeral 50 a remaining shifter remedy step of likewise removing the remaining portion of the unnecessary shifter film on the aforementioned mask substrate; numeral 51 a second mask rinsing step of rinsing the second mask thus completed; numeral 52 a mask overlap step of overlapping the main and auxiliary masks thus completed to form one mask; and numeral 53 a mask adhering step of fixing the aforementioned main and auxiliary masks with an adhesive or the like.

The first mask formed with the pattern having the shielding region and the transmissive region can be remedied at its pattern defect resulting from the mask preparing process by using a laser beam or a converged ion beam. Specifically, the residual of the shielding film, if any in the transmissive region of the first mask, can be remedied by irradiating said portion to the laser beam spot. If the shielding region is partially cut out, it can be remedied by depositing a carbon film on the defected portion with the irradiation of the converged ion beam while adding an organic gas such as the pyrene gas ($C_{16}H_{10}$).

The aforementioned second mask can be remedied by the sputtering cutting method using the aforementioned converged ion beam. The residual excess, if any, of the thin film for the phase shifter is remedied by the sputtering method, in which said excess portion is irradiated with the converged ion beam. In case the thin film portion for the phase shifter is cut out, too, this defect can be remedied by irradiating said portion with the converged ion beam to cut the transparent substrate. At this time, the depth d of the groove to be cut in the transparent substrate is set, as defined by the following relation:

$$d=\lambda/2(n-1),$$

wherein: the wavelength of the transmission light has the wavelength $\lambda$; and the groove member has the refractive index n.

Then, the two masks are individually rinsed and are so adhered to each other to have their principal surfaces opposed to each other that their principal surfaces may be kept away from foreign substances. The overlapping and adhesion of the first mask and the second mask, as shown in FIG. 3, will be described in detail hereinafter.

Next, the pattern of the second mask will be described in detail in the following because it is different depending upon the phase shifting method for giving a phase difference to the transmission light to focus a clear mask pattern image on the sample surface.

Although the aforementioned second mask has adopted the method of depositing the transparent film on the transparent substrate so as to invert the phase of the transmission light, a groove may be formed in a partial region of the transmissive region on the transparent substrate. The groove can be worked either by the sputtering method, in which a desired portion on the substrate is irradiated with the ion beam, or by the dry etching method after the resist pattern has been formed by using the electron beam exposure technology like before. The depth d of the groove is set, as defined by the following relation:

$d=\lambda/2(n-1)$, wherein: the wavelength of the transmission light has the wavelength λ; and the groove member has the refractive index n. The aforementioned sputtering treatment using the ion beam has to be followed by the plasma ashing treatment with $CF_4$ or the like after the surface to be treated has been smoothed to prevent the transmittance from dropping. Thanks to this treatment, the optical transmittance can be improved from about 90% to about 97%.

The amplitude of the light having transmitted through the first mask and the second mask of FIG. 2 is presented at (b) in FIG. 2. The amplitude of the light having reached the sample surface through the reduction projecting optical system is presented at (c) in the same Figure, and the intensity of the light is presented at (d). The contrast of the pattern transfer can also be drastically improved even through the common reduction projecting optical system.

The aforementioned first mask is formed with the pattern having the shielding region and the transmissive region, and the second mask is formed with the pattern having the phase shifter for inverting the phases of the transmission lights which have transmitted through the transmissive regions across the shielding region of the aforementioned first mask.

The aforementioned phase shifter mask can enhance the effects in a manner to match the case, in which a substantially periodic opening pattern on the mask is transferred by the reduction projecting method to the photosensitive resist film on the sample over a number of periods in at least one axial direction. At the time of this exposure, the first mask is formed with the aforementioned periodic pattern, and the second mask is formed with the pattern which is an extraction of one of the odd or even number portion of the aforementioned periodic pattern. As a result, the phase of the exposure light can be inverted in the aforementioned period to focus a clear image on the sample. The aforementioned first and second patterns are made to correspond to the periodically repeated pattern portion such as the memory array portion of the semiconductor integrated circuit so that they are enabled to enhance the effect by applying, in connection with the method of manufacturing the aforementioned semiconductor integrated circuit, to the step of forming a resist pattern for forming a band-shaped pattern on the wafer by reduction-projecting and exposing the patterns of the aforementioned first and second masks on the aforementioned wafer in a state in which a negative resist film is formed on the wafer to be exposed.

(2) Embodiment 2 (Edge-Emphasized Type Phase Shifting Mask)

Figure 4A:
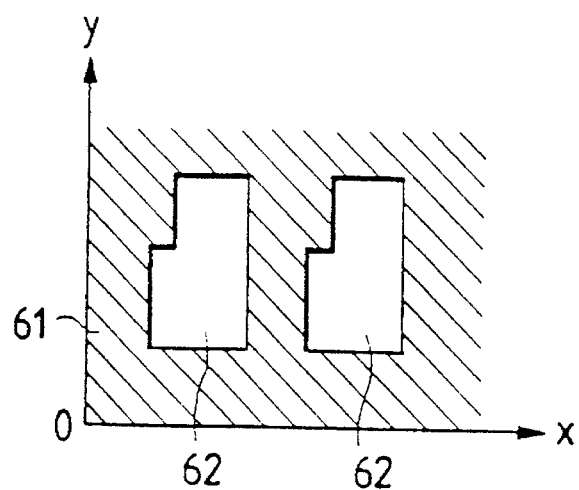
FIG. 4 is an explanatory diagram showing one example of top plan views of the mask of the present invention.
Figure 4B:
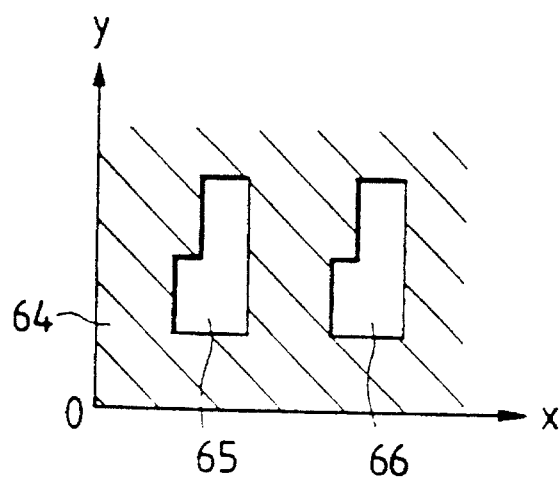
Figure 4C:
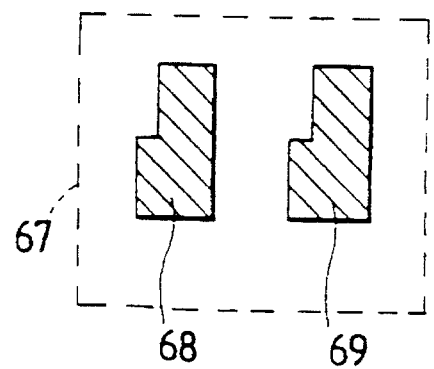
Figure 5A:
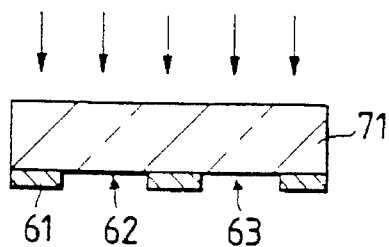
FIG. 5 is an explanatory diagram of a transfer of the mask of the present invention.
Figure 5B:
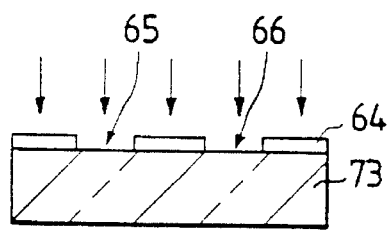
Figure 5C:
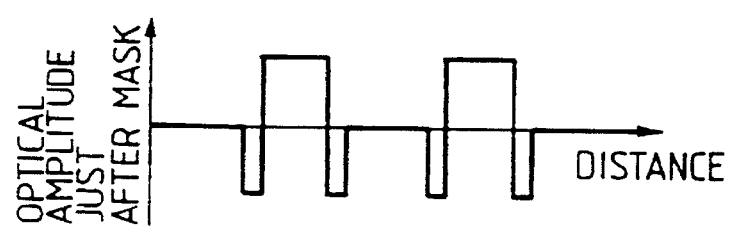
Figure 5D:
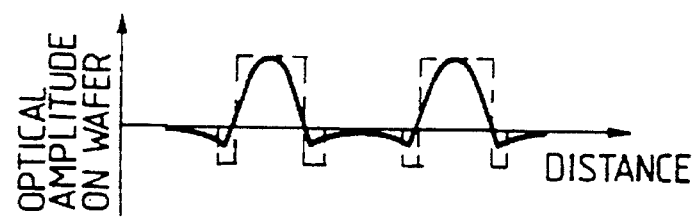
Figure 5E:
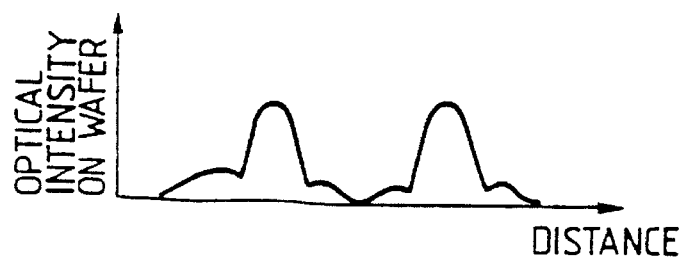

FIG. 4 shows another embodiment, i.e., a structure of a mask pattern, in which the "edge-emphasized type phase shifting method" is applied to the "closely opposed mask phase shifting method" of the present invention. FIG. 4(a) shows one example of the pattern of the first mask, an FIG. 4(b) shows one example of the pattern of the second mask. FIG. 4(c) shows a projected pattern to be transferred to the sample (i.e., wafer). The aforementioned first pattern is formed with the pattern having the shielding region and the transmissive pattern, and the second pattern is formed with the pattern having the phase shifter for inverting the phases of the transmission lights in the transmissive region of the aforementioned first mask. In FIG. 4: reference numeral 61 designates a shielding chrome film on the main mask; numerals 62 and 63 non-shift main openings, i.e., the openings or optical transmissive portions corresponding to the pattern; numeral 64 a phase shifter film; numerals 65 and 66 non-shift auxiliary openings having none of the aforementioned shifter films but the mask substrate substantially exposed; numeral 67 a partial region of the wafer to be treated; and 68 and 69 patterns to be formed on the aforementioned wafer.

FIG. 5 is an explanatory diagram for explaining the operations of FIG. 4. FIGS. 5(a) and 5(b) present mask sections; and FIGS. 5(c) to 5(e) present optical amplitude and intensity distributions for explaining the operations of the aforementioned mask of the present embodiment. In the same Figure, reference numeral 71 designates a main mask substrate (i.e., a first mask), and numeral 73 designates an auxiliary mask substrate (i.e., a second mask). The amplitude of the light having transmitted through the aforementioned first and second masks is plotted in FIG. 5(c). The amplitude having reached the sample surface through a reduction projecting optical system is plotted in FIG. 5(d), and the intensity of the light is presented in FIG. 5(e). The contrast of the pattern transfer can be likewise improved.

The pattern of the aforementioned first mask uses the pattern of a desired integrated circuit. On the contrary of the first mask pattern, the pattern of the second mask pattern uses the pattern which has been subjected to a data transformation by a computer such as the data transformation, in which the width is thinned with the position of the pattern of the transmissive region being unchanged (as will be called the "sizing process"), or the data transformation, in which the contour of the first mask pattern is extracted (as will be called the "contour decomposing process").

The aforementioned patterns of the first mask and the second mask call also correspond unlike the example of FIG. 2 to a non-periodic pattern of the pattern of the semiconductor integrated circuit device. The patterns of the first and second masks can be effectively applied, as to the process for manufacturing the aforementioned semiconductor integrated circuit, to the step of forming a resist pattern for forming a band-shaped pattern on a wafer by the reduction-projecting exposure of the wafer to the patterns on the first and second masks with a negative type resist film being applied to the exposed wafer.

Figure 6A:
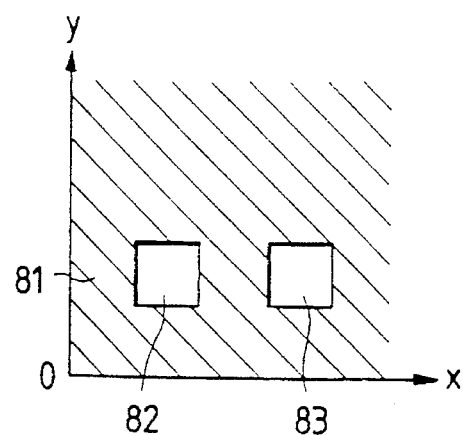
FIG. 6 is an explanatory diagram showing one example of registering marks of the mask of the present invention.
Figure 6B:
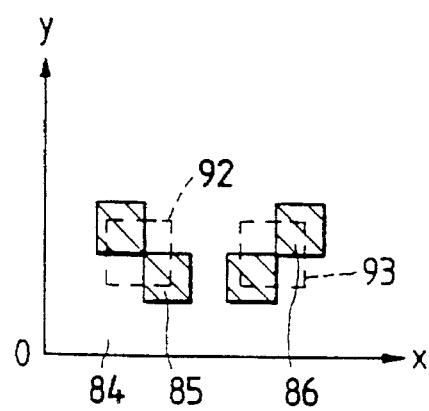

The position of overlapping the first and second patterns raises a problem, which can be solved by forming the masks with positioning mark patterns. FIG. 6 presents one example of the positioning mark pattern. FIG. 6(a) presents the mark pattern of the first mask, and FIG. 6(b) presents the mark pattern of the second mask. In the same Figure: reference numeral 81 designates a shielding chrome film on the main mask; numerals 82 and 83 non-shift main openings corresponding to the positioning marks on the main mask; numeral 84 an exposed portion of the auxiliary mask to the glass substrate; numerals 85 and 86 shift patterns corresponding to the positioning marks; and numerals 92 and 93 the positions of the main openings 82 and 83 on the auxiliary mask when the main mask and the auxiliary mask are overlapped. Numeral 87 designates an upper main surface of a wafer to be treated; numerals 88 and 89 outer peripheries of the positioning patterns focused on the wafer by the positioning patterns; and numerals 90 and 91 cross patterns which are formed by the interference of the lights having transmitted through the positioning patterns of the main mask and the auxiliary mask.

Figure 6C:
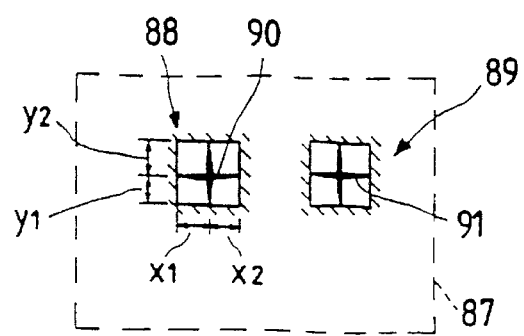

By using the combination, as shown in the same Figure, the cross pattern shown in FIG. 6(c) is detected as a diffracted projection image formed by synthesizing the first mask and the second mask. Thus, the positioning error can be measured from the positional difference $(x_1-x_2, y_1-y_2)$ between the cross pattern and the frame, as shown in FIG. 6(c), by forming two or more combination patterns in the peripheral portion of the mask substrate.

Figure 7:
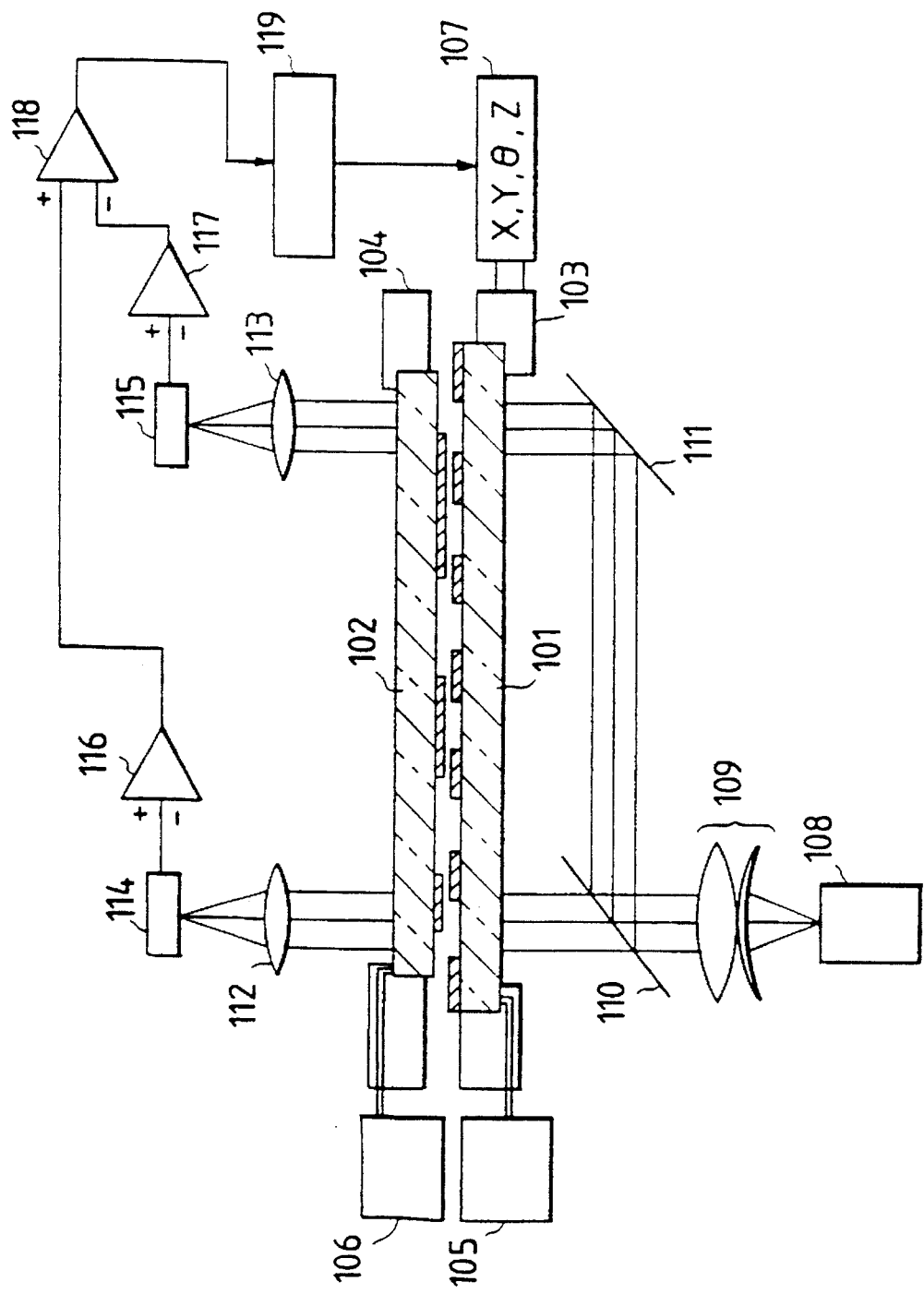
FIG. 7 is an explanatory diagram showing one example of a mask registering method of the present invention.
Figure 8A:
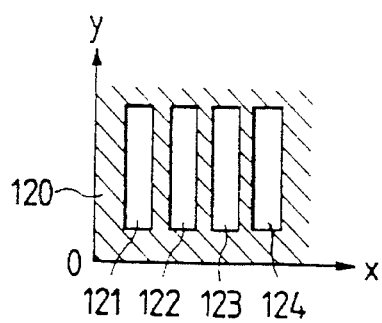
FIG. 8 is an explanatory diagram showing another example of the mask of the present invention.
Figure 8B:
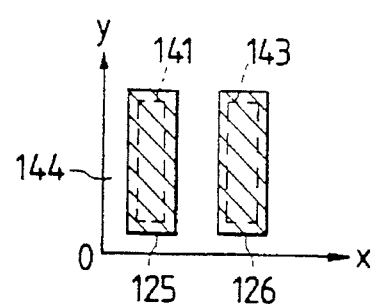
Figure 8C:
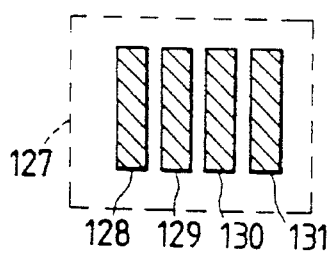
Figure 8D:
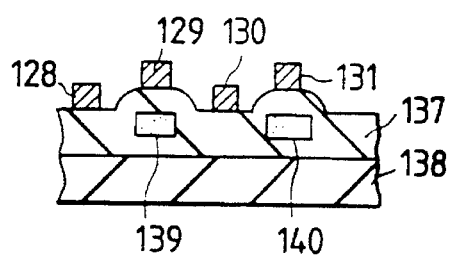
Figure 8E:
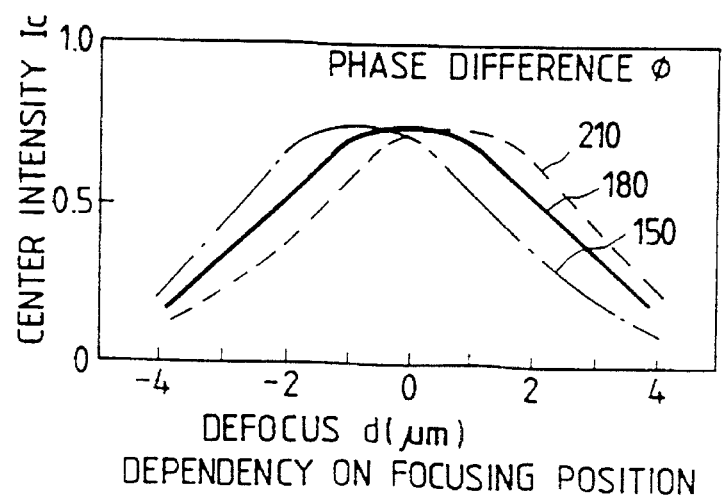

FIG. 7 is an explanatory diagram showing one example of a method of overlapping the aforementioned first and second masks. In the same Figure: reference numeral 101 designates a main mask (i.e., first mask); numeral 102 an auxiliary mask (i.e., second mask); numeral 103 a main mask holder or first mask stage having a vacuum chuck; numeral 104 an auxiliary mask holder or second mask stage likewise having a vacuum chuck; numeral 105 a vacuum chuck control unit for the main mask holder; numeral 106 a vacuum chuck control unit for the auxiliary mask; numeral 107 drive means for driving the aforementioned stages in X (horizontally parallel in parallel with the paper surface), Y (horizontally translational normal to the paper surface), Z (vertically translational) and Θ (rotational on a vertical axis extending through a central portion of the masks) directions; numeral 108 a monochromatic light source having a wavelength identical to that of the actual exposure; numeral 109 an illumination lens such as a condenser lens; numeral 110 a half mirror for halving the illumination light; numeral 111 a reflecting mirror; numeral 112 a first projection lens for projecting the pattern on the mask; numeral 113 a second projection lens for likewise projecting the pattern on a mask; numeral 114 a first image sensor for detecting the projected pattern; numeral 115 a second image sensor for likewise detecting the projected pattern; numeral 116 a first amplifier for amplifying the output of the first image sensor; numeral 117 a second amplifier for likewise amplifying the output of the second image sensor; numeral 118 a comparator for comparing those outputs; and numeral 119 a stage control unit for controlling the stage drive means 107 on the basis of the output of the comparator 118. As has been described hereinbefore, the first mask and the second mask are separately prepared. At this time, an adhesive is applied to one of the first and second masks around the mask substrate. The positioning masks used for the first mask and the second mask are shown in FIG. 6.

As shown in FIG. 7, the first mask is carried on the first stage, which can move in the X and Y (translational) directions, in the Θ (rotational) direction and in the Z (vertical) direction, and the second mask is carried in proximity of the first mask on the second stage which is independent of the first stage. The aforementioned Z (vertical) moving mechanism may be disposed in the second stage. At this time, the individual masks are absorbed and held on the corresponding stages by the vacuum chucks. The marks are exposed from their backs to the lights having the same wavelengths as those for the exposure. The positional and rotational discrepancies between the first mask and the second mask are measured through the aforementioned combination marks and fed back to the first stage. Specifically, the positioning marks shown in FIG. 6 are used with the image sensor, and a control signal for driving the first stage is produced by the comparator from the positional difference $(x_1-x_2, y_1-y_2)$ between the cross pattern and the frame. The Θ (rotational) error can be corrected by measuring the positional error, by correcting the positional displacement of one point on the first mask in the X and Y (plane) and by aligning that point with another point.

After the first mask and the second mask have been positioned, the first stage is moved in the Z (vertical) directions, and the principal surfaces of the first and second masks are fixed close to each other. At this time, the patterns of the individual principal surfaces of the first and second masks may be held in contact with each other.

(3) Embodiment 3 (Multi-Image Plane Phase Shift Mask)

FIG. 8 shows the structure of a mask pattern of another embodiment. FIG. 8(*a*) presents one example of the pattern of a first mask; FIG. 8(*b*) presents one example of the pattern of a second mask; and FIG. 8(*c*) presents a projection pattern to be transferred to a sample. In the same Figure: reference numeral 120 designates an optically shielding chrome portion of the main mask or first mask; numerals 121 to 124 linear openings or optically transmissive portions on the main mask, which are arranged at a constant pitch and in parallel for Al wiring lines; numeral 144 the exposed glass surface of the auxiliary mask or second mask; numerals 125 and 128 shifter regions covered with a transparent film having a constant thickness for inverting the phases of lights; numerals 141 and 143 the positions corresponding to the optically transmissive portions 121 and 123 on the main mask and indicated by broken lines; numeral 127 a predetermined region of the wafer to be treated; numerals 128 to 131 linear patterns to be formed on the aforementioned wafer by the main mask and the auxiliary mask; numeral 138 either the upper principal surface of a single-crystal Si wafer to be used as a semiconductor substrate or an epitaxial single-crystal Si layer formed over the upper principal surface; numeral 187 an insulating protective film such as an oxide film formed over the principal surface of the wafer or the like; and numerals 189 and 140 gate electrodes such as word lines made of poly-Si, polycide, silicide or refractory metal.

The first mask is formed with a pattern having a shielding region and a transmissive region, and the second mask is formed with a pattern having a phase shifter for shifting the phase of the light, which has transmitted through the transmissive region of the first mask. The first mask is formed with a pattern having a shielding region and a transmissive region, and the second mask is formed with a pattern having a phase shifter for changing the phase difference between the lights having transmitted through the transmissive regions across the shielding region of the first mask, in a manner to correspond to different focusing positions depending upon the surface steps on the sample. The phase shifting amounts of this case are determined by changing the thickness of the film on the second mask acting as the phase shifter.

The aforementioned pattern is made to correspond to the seeps on the sample surface, as shown in FIG. 8(*d*). Incidentally, the focusing position can be changed by changing the phase difference of the transmission light, as shown in FIG. 8(*e*).

(4) Embodiment 4 (Auxiliary Shifter Type Phase Shift Mask)

Figure 9A:
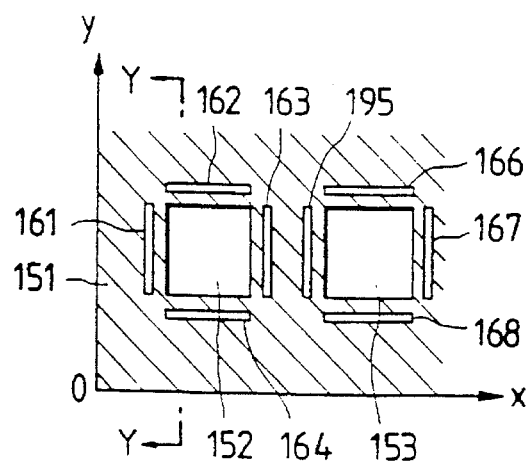
FIG. 9 is an explanatory diagram showing another example of the mask of the present invention.
Figure 9B:
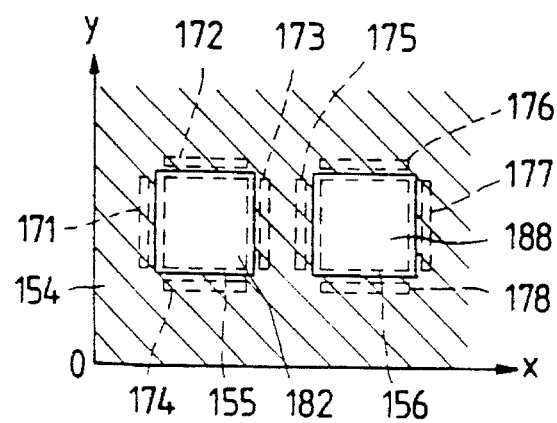
Figure 9C:
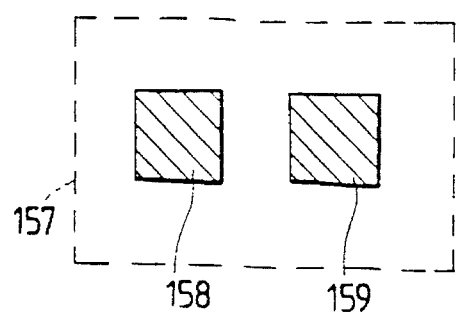

FIG. 9 shows the structure of a pattern of a mask of another embodiment. FIG. 9(*a*) presents one example of the pattern of a first mask, and FIG. 9(*b*) presents one example of the pattern of a second mask. FIG. 9(*c*) presents a projected pattern to be transferred to a sample. In the same Figure: reference numeral 151 designates a shielding chrome region of the main mask or first mask; numerals 152 and 153 opening regions or optically transmissive regions corresponding to an actual pattern; numerals 161 to 164 auxiliary openings for peripheral independent sub-shifters for the aforementioned main opening 152; numerals 165 to 168 auxiliary openings for the aforementioned main opening 153; numeral 154 shifter film formed over the auxiliary mask to have a constant thickness; numerals 155 and 156 exposed mask substrate portion or non-shift auxiliary openings having none of the aforementioned shifter film; numerals 171 to 178 the positions corresponding to the auxiliary openings 161 to 168 on the shifter film 154 and indicated by single-dotted lines; numerals 182 and 183 the positions of the aforementioned main openings 152 and 153 and indicated by broken lines; numeral 157 a predetermined portion of a wafer to be treated; and numerals 158 and 159 isolated actual patterns on the wafer such as contact holes formed by the aforementioned masks. The first mask is formed with a pattern having a shielding region and a transmissive region and with fine auxiliary transmissive regions around the main transmissive region thereof, and the second mask is formed with a pattern having a phase shifter for shifting the phases of the light having transmitted through the main transmissive region of the first mask and the light having transmitted through the surrounding fine auxiliary transmissive regions.

At the time of manufacturing a semiconductor integrated circuit device by reduction-projecting and exposing a desired pattern with an ultraviolet or far ultraviolet monochromatic light, the aforementioned mask is enabled to enhance the effect by applying it to a seep of forming a resist pattern for opening the contact holes by reduction-projection exposing a wafer to be exposed to the patterns on the first mask and the second mask with a positive resist film being formed on that wafer.

Figure 12:
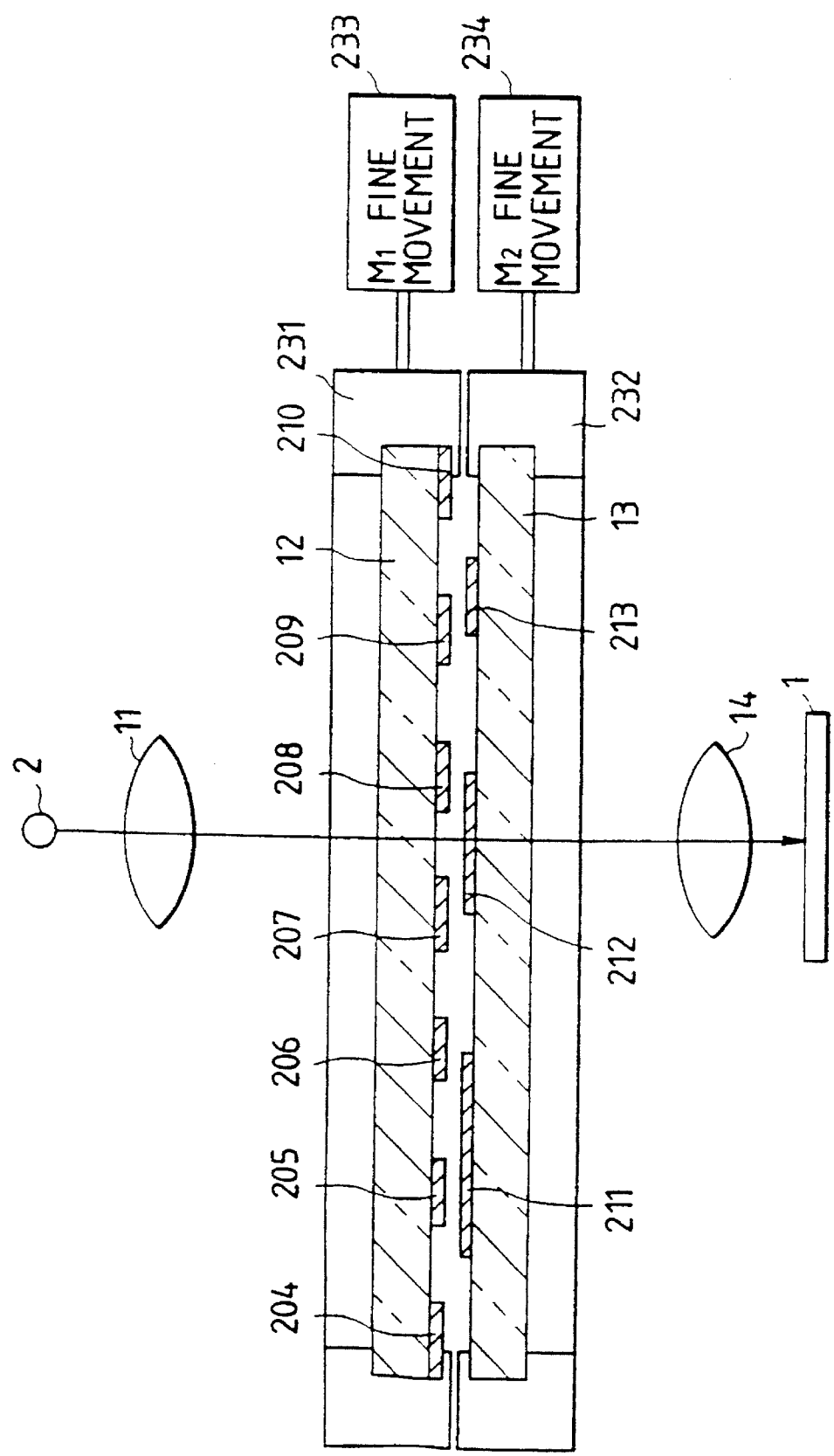
FIG. 12 is an explanatory diagram showing one example of an exposure device of the present invention.
Figure 13A:
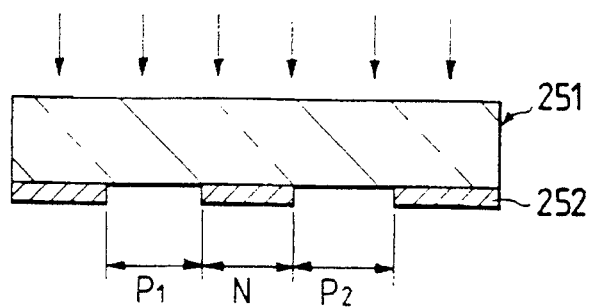
FIG. 13 is an explanatory diagram showing a mask transfer of the prior art.
Figure 13B:
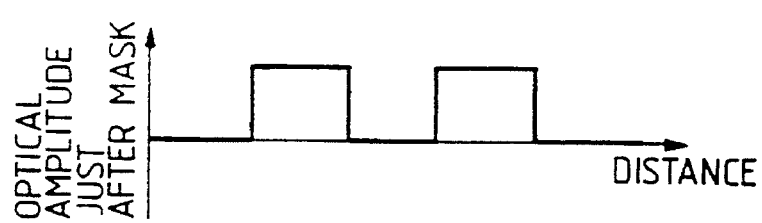
Figure 13C:
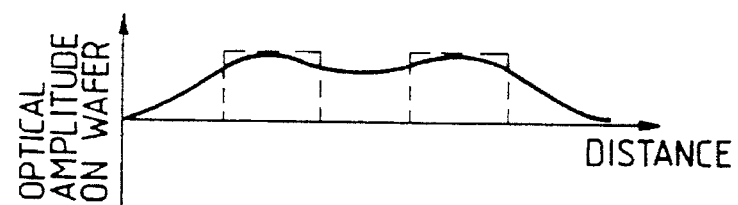
Figure 13D:
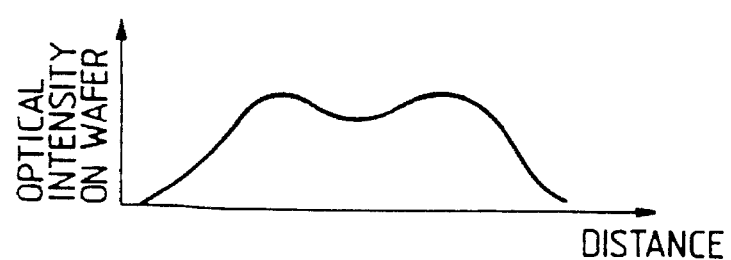
Figure 14A:
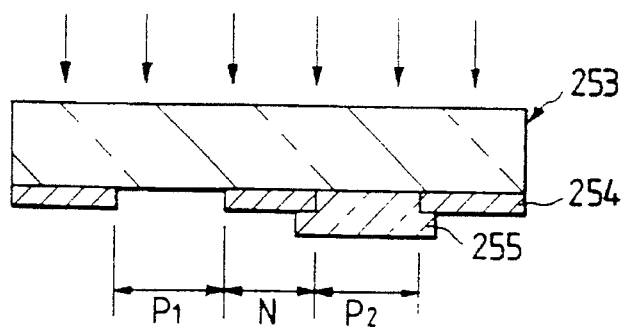
FIG. 14 is an explanatory diagram showing a transfer of a phase shifting mask.
Figure 14B:
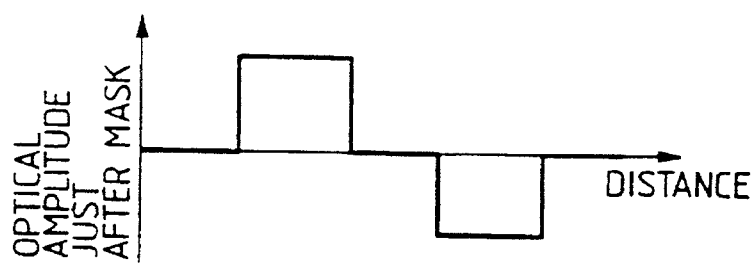
Figure 14C:
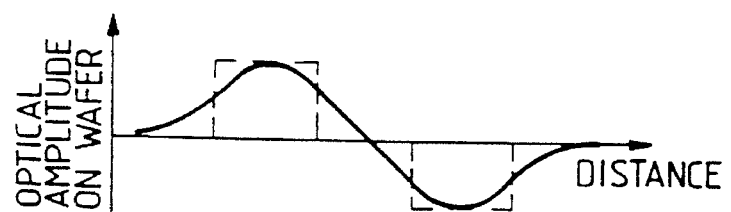
Figure 14D:
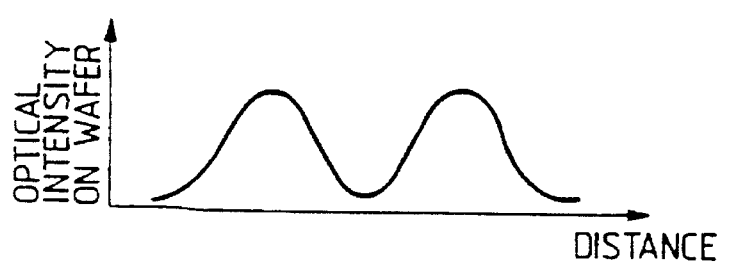

In the embodiment of FIG. 1, the aforementioned first mask and second mask are independently provided with positioning functions. FIG. 12 schematically shows the positioning functions of the first and second masks. In the same Figure: the reference numeral 12 designates the main mask or first mask; the numeral 13 the auxiliary mask or second mask; numerals 204 to 210 shielding chrome films formed over the main mask; numerals 211 to 213 shift patterns of a phase shift pattern formed over the auxiliary mask; numeral 231 a main mask holder for holding the main mask; numeral 232 an auxiliary mask holder for holding the auxiliary mask; numeral 233 main mask moving means or first mask moving means for moving the main mask holder in the X-Y directions; and numeral 234 auxiliary moving means or second mask moving means for moving the auxiliary mask holder in the X-Y directions. The first mask and the second mask are carried on the holders independently of each other and are moved in the directions of the X and Y axes and in the rotational directions by the fine moving mechanisms so that they are positioned.

The first and second masks can be positioned by forming the individual mask substrate with positioning mask patterns in accordance with the method shown in FIG. 6.

(5) Embodiment 5 (Discretely Adhered Mask)

Figure 10:
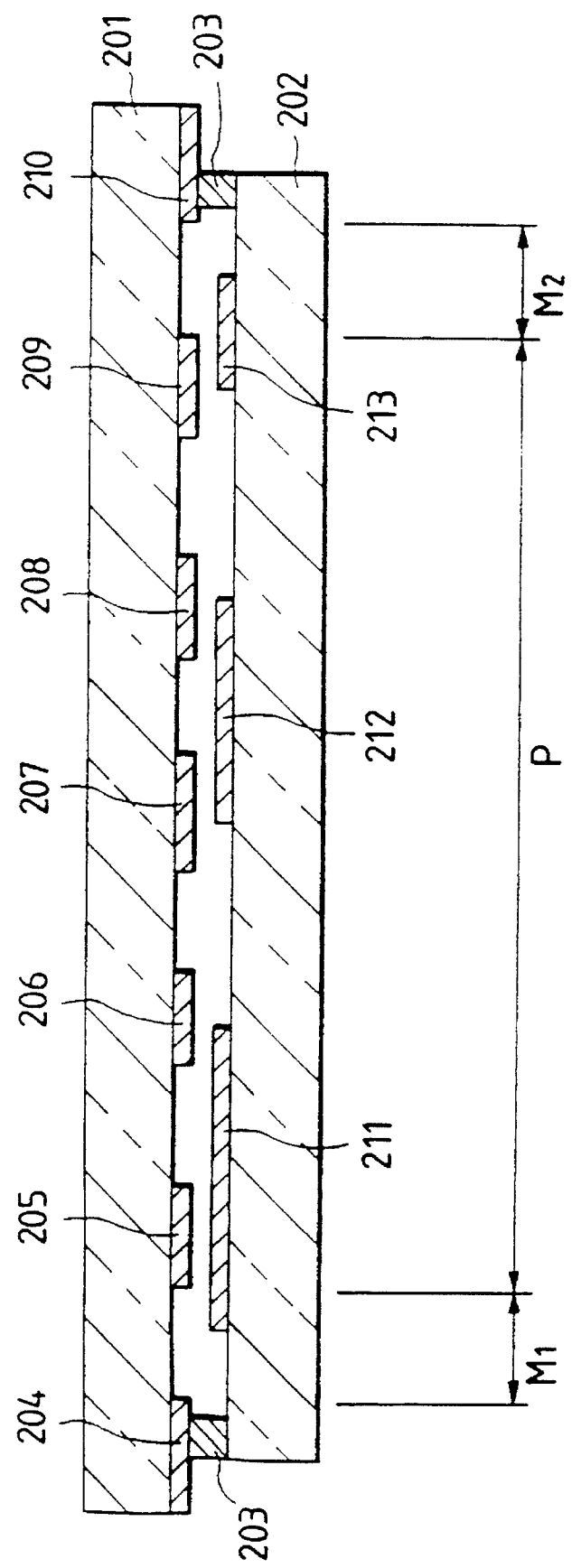
FIG. 10 is an explanatory section showing another example of the mask of the present invention.

FIG. 10 shows the structure of a mask of another embodiment. In the same Figure: reference numeral 201 designates a main mask or first mask; numeral 202 an auxiliary mask or second mask; numeral 203 a mask junction ring for sealing the peripheral portions of the main mask and the auxiliary mask; the numerals 204 to 210 the shielding chrome films formed over the main mask; and the numerals 211 to 213 the shift patterns of the phase shift film formed over the auxiliary mask.

As shown in the same Figure, the first mask and the second mask are fixed and integrated at the peripheral portion of the substrate. At this time, the positioning of the first mask and the second mask can be confirmed like before. In this instant, a reduction-projection exposing system of the prior art can be used by enlarging the external sizes of the first mask and the second mask. These first and second masks are fixed by means of an adhesive such as glass epoxy. By sealing the peripheral portion of the transparent substrate, moreover, it is possible to prevent foreign substances from migrating into or sticking to the principal surfaces of the first and second masks.

The aforementioned second mask can be formed on the principal surface of the transparent substrate with a pattern having a phase shifter for establishing a phase difference in a transmission light and can be thickened to about 2 mm or more to prevent the foreign substances having stuck to the back from being defocused and transferred.

(6) Embodiment 6 (Close Contact Type Mask)

Figure 11:
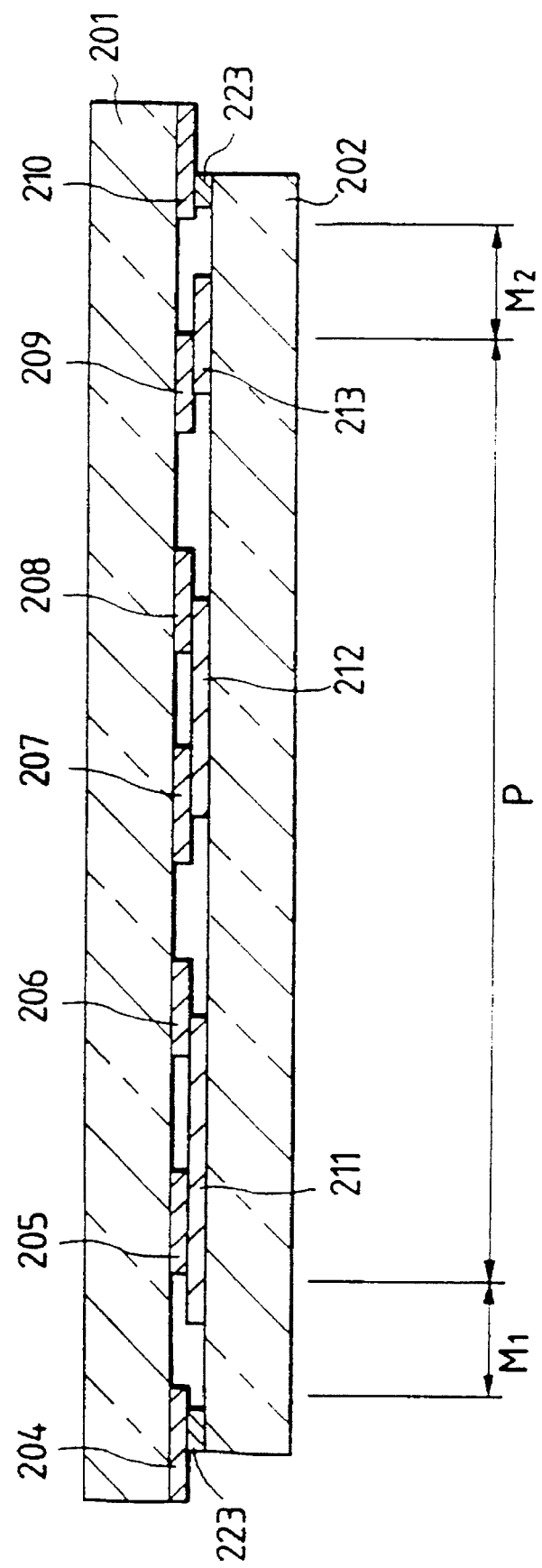
FIG. 11 is an explanatory section showing another example of the mask of the present invention.

In FIG. 11, the first mask and the second mask of FIG. 10 are in contact with each other. Thus, the laminating allowance of the first and second masks can be increased. In the same Figure, reference numeral 223 designates a ring-shaped adhesive layer corresponding to the aforementioned mask junction ring 203.

(7) Embodiment 7 (Mask Planar Layout)

Figure 15:
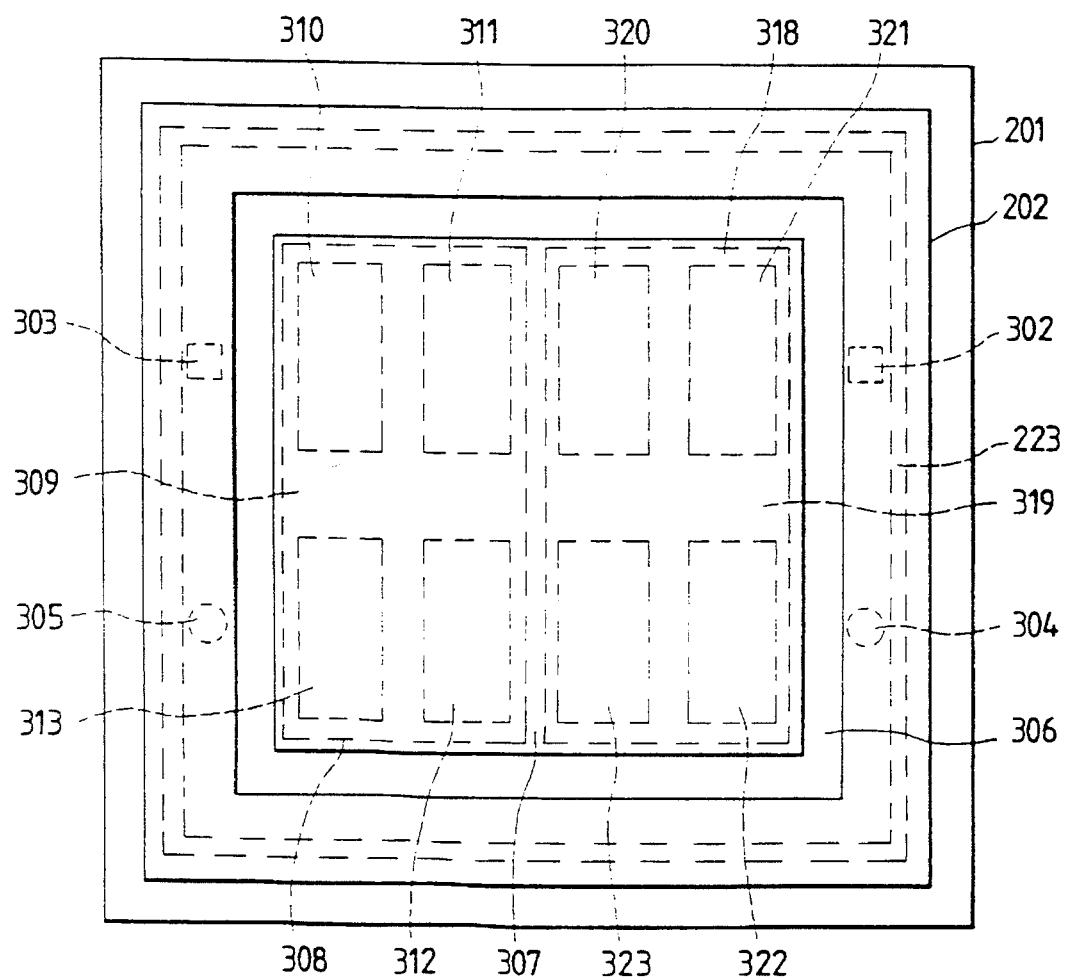
FIG. 15 is a top plan layout in the state, in which paired masks of the present invention are registered.

FIG. 15 is a planar layout showing the state, which the paired masks of the present invention are positioned. The mask laminating structure of FIG. 11 will be conveniently described in the following, but absolutely similar descriptions apply to the structure of FIG. 10 or 12. In FIG. 15: reference numerals 302 and 303 designate wafer positioning marks with the wafer 1 (of FIG. 1); numerals 304 and 305 inter-mask positioning marks for positioning the main mask and the auxiliary mask corresponding to FIG. 6(*c*); numeral 306 a mask blinding shielding chrome band; numeral 307 a portion corresponding to a scribe line on the wafer 1; numerals 308 and 318 portions corresponding to a unit chip region (e.g., DRAM of 64 Kilobits) on the wafer, respectively; numerals 309 and 319 portions corresponding to the peripheral circuit regions of the memory IC, respectively; and numerals 310 to 313 and 320 to 323 portions corresponding to the memory mats of the memory IC, respectively.

(8) Embodiment 8 (Boundary Chromeless Phase Shift Mask)

Figure 16A:
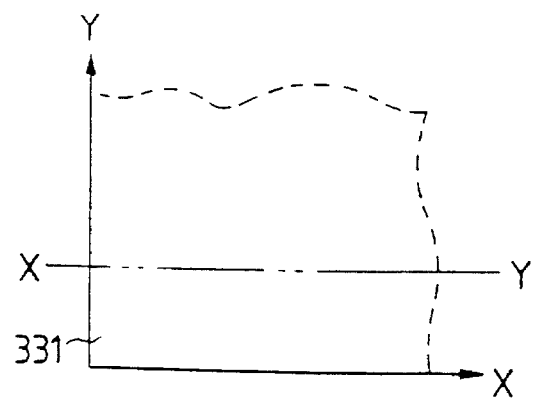
FIG. 16 is a top plan view showing a mask in a boundary type chromeless phase shifting method of the present invention and a pattern on a wafer to be formed by the mask.
Figure 16B:
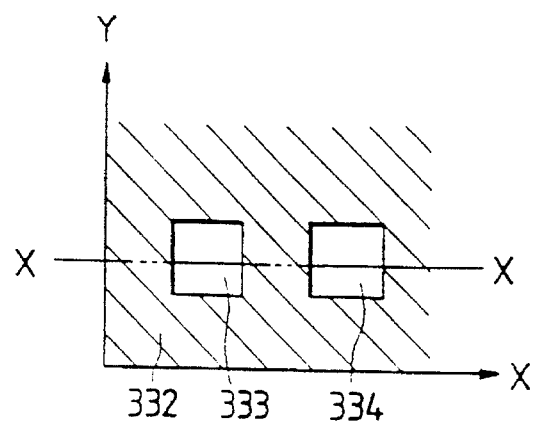
Figure 16C:
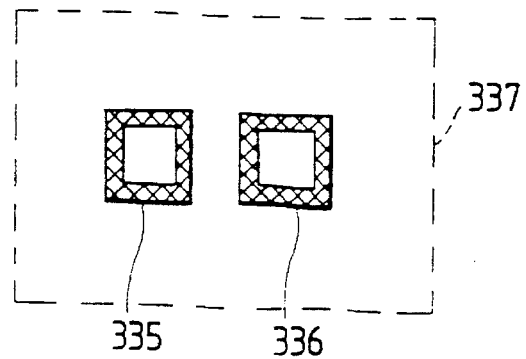
Figure 17A:
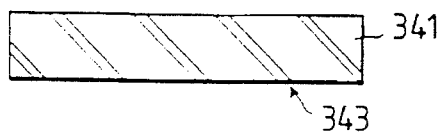
FIG. 17 presents a section of the same mask and a distribution diagram of an optical intensity and so on for explaining the operation of the same.
Figure 17B:
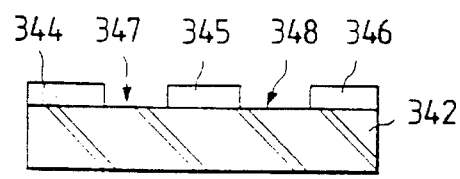
Figure 17C:
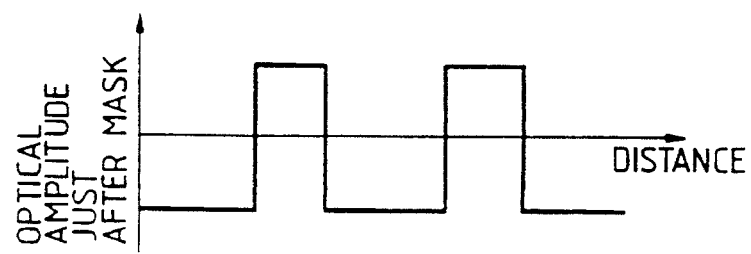
Figure 17D:
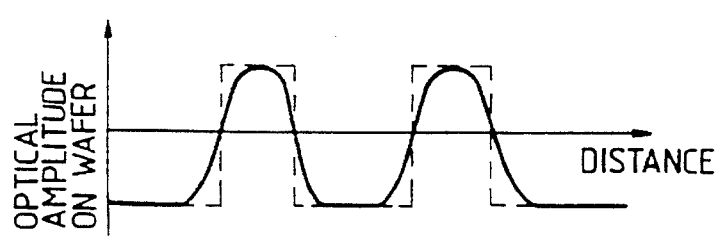
Figure 17E:
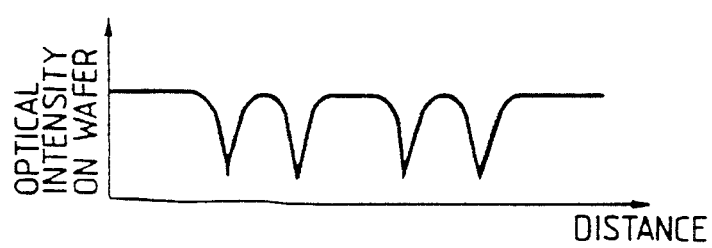

FIG. 16 is a top plan view showing a mask according to the boundary type chromeless phase shift mask and a pattern over a wafer to be formed by the mask. FIG. 17 presents a section showing the same mask and a distribution diagram of an optical intensity or the like for explaining the operations of the same. In the same Figures: reference numeral 331 an exposed quartz surface of a main mask; numeral 332 a shift film surface of an auxiliary mask; numerals 333 and 334 short-connection exposed region overlying the auxiliary mask and having none of the shifter film; numeral 337 a predetermined portion of the wafer to be treated; numerals 335 and 336 shielding patterns to be formed over the wafer; numeral 341 a main mask substrate; numeral 342 an auxiliary mask substrate; numeral 343 a main mask principal surface; numerals 344 to 346 individual shifter film patterns; and numerals 347 and 348 exposed patterns corresponding to the regions 333 and 334.

(9) Embodiment 9 (Isolated Hole Type Chromeless Phase Shift Mask)

Figure 18A:
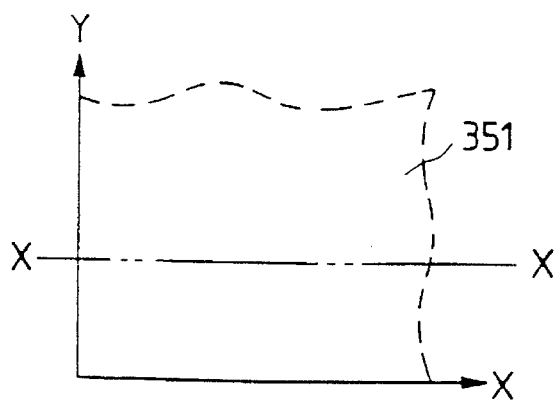
FIG. 18 is a top plan view showing a mask in a chromeless phase shifting method of the present invention for forming isolated holes and a pattern to be formed thereby on a wafer.
Figure 18B:
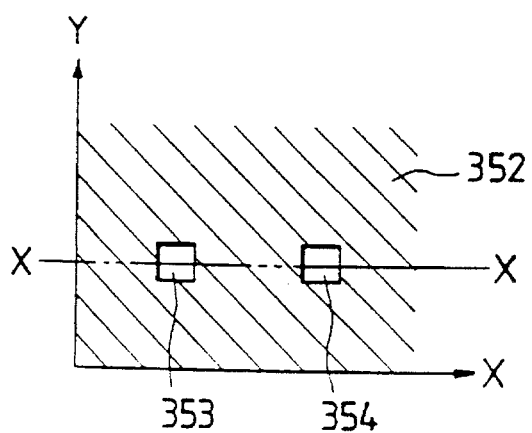
Figure 18C:
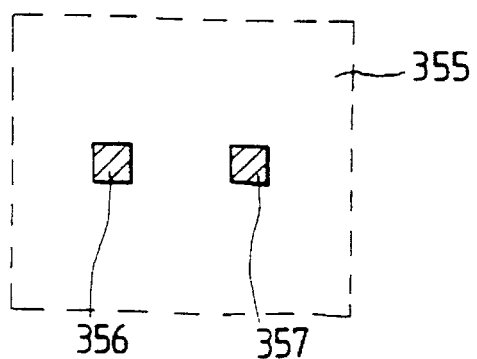
Figure 19A:
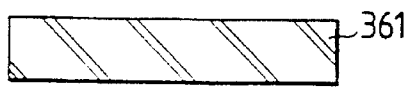
FIG. 19 is a distribution diagram of an optical intensity and so on for explaining the operation of the same.
Figure 19B:
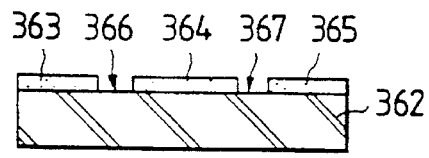
Figure 19C:
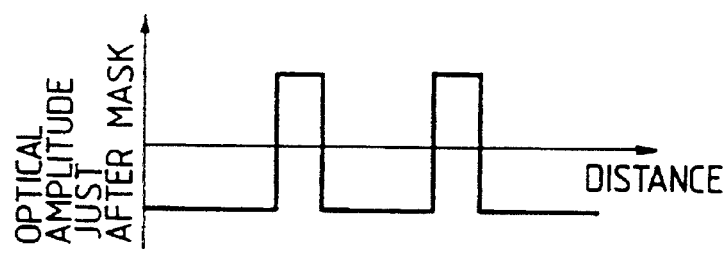
Figure 19D:
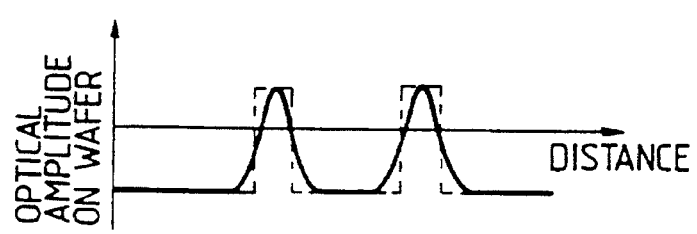
Figure 19E:
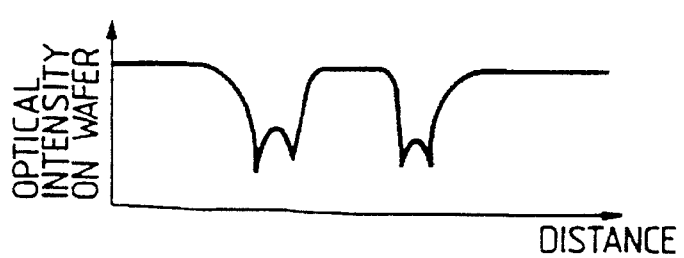

FIG. 18 is a top plan view showing a mask in the chromeless phase shift method for forming isolated holes or the like and a pattern to be formed over the wafer by the mask. FIG. 19 presents a sectional showing the same mask and a distribution diagram of an optical intensity or the like for explaining the operations of the mask. In the same Figures: reference numeral 351 designates a quartz exposed surface of the main mask; numeral 352 a shifter film surface of the auxiliary mask; numerals 353 and 354 short-connection exposed regions overlying the auxiliary mask and having none of the shifter film; numeral 355 a predetermined portion of the wafer to be treated; numerals 356 and 357 shielding patterns to be formed over the wafer; numeral 361 a main mask substrate; numeral 362 an auxiliary mask substrate; numerals 363 to 365 individual shifter film patterns; and numerals 366 and 367 exposed patterns corresponding to the regions 353 and 354.

(10) Embodiment 10 (Detail of Mask Adhering Method)

Figure 20A:
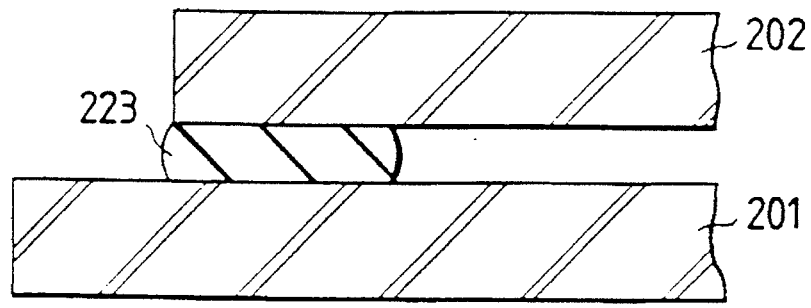
FIG. 20 is a section of a mask bonding portion showing the detail of the adhesion of laminated masks of the present invention.
Figure 20B:
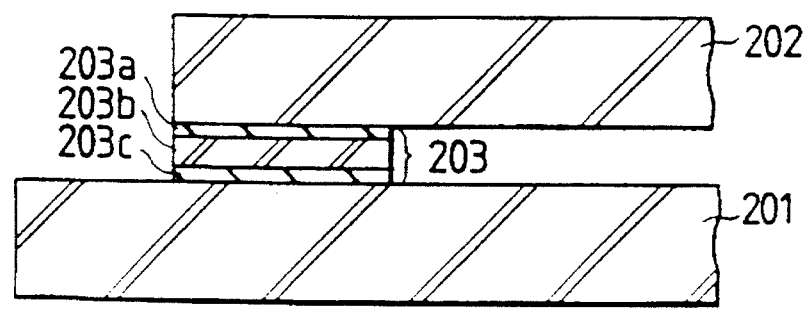

FIG. 20 is a section of a mask junction portion showing the detail of adhesion of the adhered mask of the present invention. In the same Figure, reference numerals 203a and 203c designate adhesive layers, and numeral 203b designates an intermediate spacer. In a first method shown in FIG. 20(a), the main mask and the auxiliary mask are adhered by the acryl emulsion adhesive 223. In the method shown in FIG. 20(b), on the other hand, the adhesion is carried by using polyethylene terephthalate as the tape agent 203b and by using a double-coated tape having its two faces coated with the acryl emulsion adhesives 203a and 203c.

(11) Embodiment 11 (Organic Shifter Protection)

Figure 21:
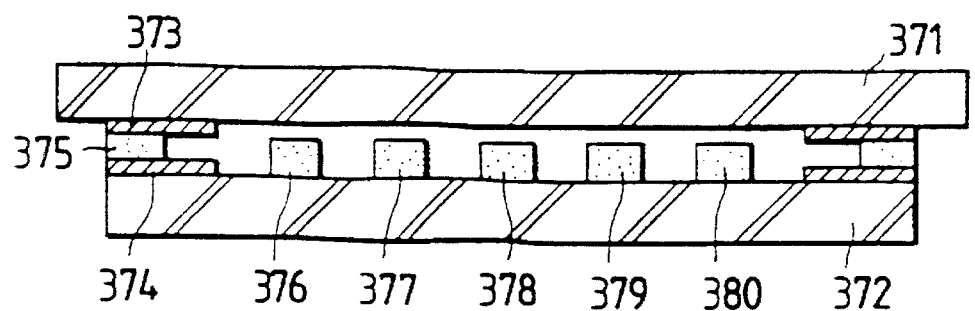
FIG. 21 is a section showing a closely opposed mask showing another embodiment of a mask material.

FIG. 21 is a section of a closely opposed mask showing another embodiment of the mask material. In The same Figure: reference numeral 371 a main mask substrate; numeral 372 an auxiliary mask substrate; numerals 373 and 374 shielding chrome layers; numeral 375 an adhesive layer; and numerals 376 to 380 organic shifter films.

In the present embodiment, the shifter patterns 376 to 380 are formed by drawing an electron beam resist with an electron beam. Incidentally, the auxiliary mask substrate 372 need not be adhered to the quartz substrate 371 but may be overlaid as usual by a pellicle film. Then, the manufacture of the mask to be used in the on-mask phase shift method can be facilitated.

(12) Embodiment 12 (Self-Alignment Mask Manufacture)

Figure 22:
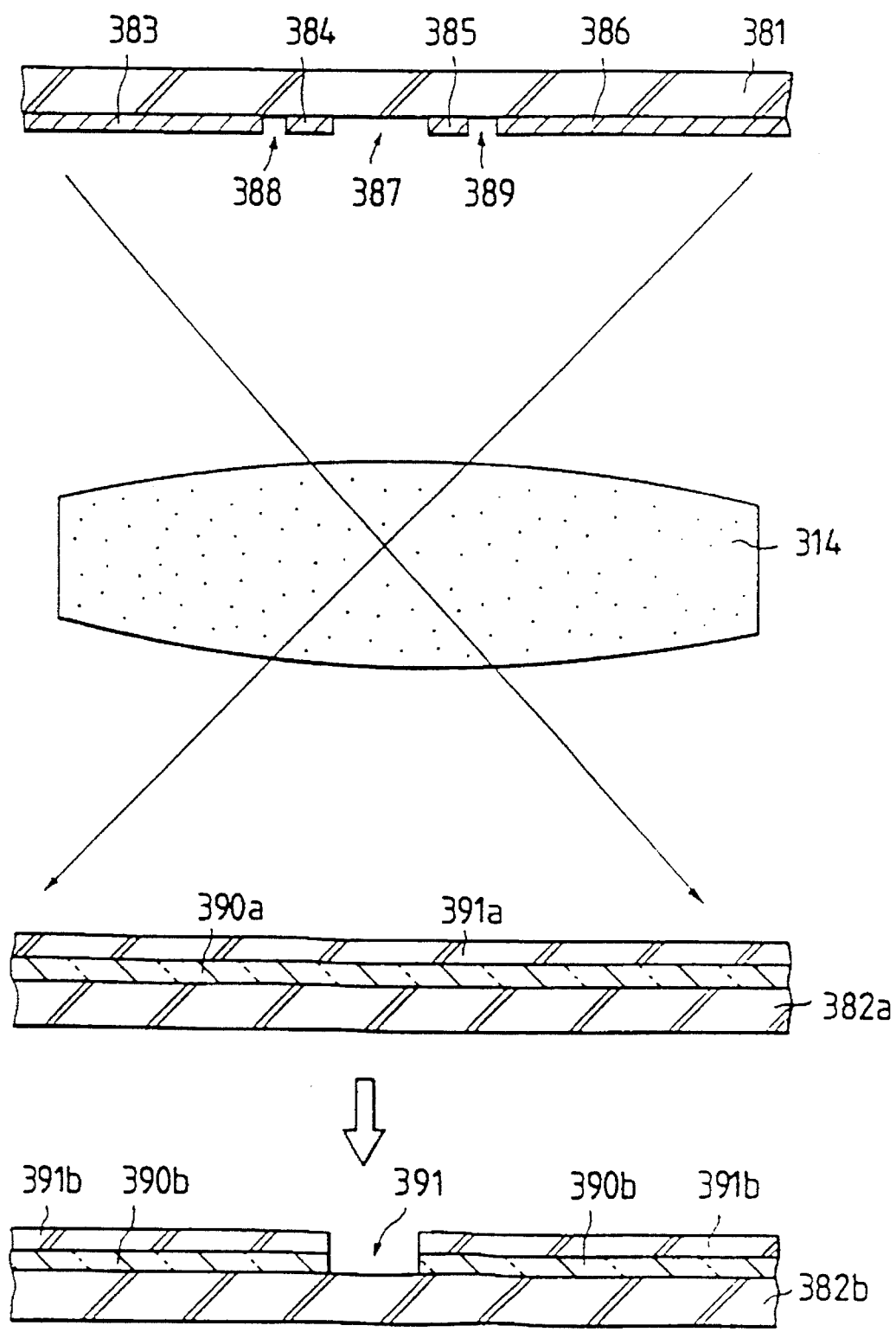
FIG. 22 is a schematic section showing a process for forming an auxiliary mask in self-alignment using an i-line from a main mask according to another embodiment of the present invention.

FIG. 22 is a schematic section showing a process for forming an auxiliary mask in self-alignment from a main mask by means of an 1:1 projection exposing system using the g- or i-line. In the same Figure: reference numeral designates a projection lens of the projection exposing system; numeral 381 a main mask; numerals 383 to 386 shielding chrome films; numeral 387 an opening pattern corresponding to an actual pattern; numerals 388 and 389 auxiliary openings corresponding to an auxiliary shifter; numeral 382a an auxiliary mask for exposure; numeral 382b the same auxiliary mask for development; numeral 391a a resist film for exposure; numeral 391b the same resist film for development; numeral 390a a shifter film for exposure; numeral 390b the same shifter film for development; and numeral 391 an actual opening (i.e., a portion having no shifter film) corresponding to the aforementioned opening pattern.

Next, the mask forming method of the present invention will be described on the basis of the example of FIG. 9 (presenting the X-Y section) with reference to FIG. 22. The present method is characterized in that the shifter pattern of the auxiliary mask is optically exposed in self-alignment from the main mask having a chrome pattern. First of all, the main mask is projected on the mask substrate 382a, which is to be formed into the auxiliary mask by the projection lens 314 having such a low NA as to resolve the subshifters 388 and 389 on the main mask, such that the photosensitive positive resist film 391a is applied to the shifter film 390a. Then, only the developed portion is removed as the opening because no portion other than the actual opening 387 is opened. If the lower shifter film 390b is etched by using the patterned resist film 391b as the mask, only the portion 391 corresponding to the actual opening 387 of the main mask is removed. After this, the auxiliary mask is completed by removing the unnecessary resist film 391b.

(13) Citations of References for Supplementing Embodiments

The detail of the edge emphasized type phase shift method and its mask designing method are made to form part of the description of the present specification because they are disclosed in our Japanese Patent Laid-Open No. 140743/1990, as laid open on May 30, 1990, (i.e., Japanese Patent Application No. 295350/1988, as applied on Nov. 22, 1988).

Moreover, the mask pattern layout, the negative or positive resist materials (of which the positive resist is exemplified by Ray Cast RI-7000P of HITACHI KASEI and the negative resist is exemplified by chemically amplified negative resist Ri-1900YD of the same Maker) and the process of the same resist, the exposing light source in the edge emphasized type phase shift method, the Levenson type phase shift method and the auxiliary shifter type shift method, and their applications to a semiconductor integrated circuit device such as DRAM or SRAM are made to form part of the description of the present specification because they are disclosed in our Japanese Patent Application No. 247100/1990 (filed on Sep. 19, 1990).

Although our invention has been specifically described in connection with its embodiments, it should not be limited to those embodiments but can naturally be modified in various manners without departing from the gist thereof.

For example, there has been described the method of using the pattern which has its data converted by the computer, such as the data conversion (as will be referred to as the "sizing"), in which the phase shifting pattern data have their width thinned while leaving the position of the pattern of the transparent region unchanged, and the data conversion (as will be referred to as the "contour decomposition"), in which the contour of the pattern of the aforementioned first mask is extracted. Despite of this description, however, the present invention should not be limited thereto but can be modified in various manners. For example, the pattern may be formed by taking a difference the pattern of an original transmissive region from the pattern which is formed by magnifying the pattern of the transmissive region.

The material for the phase shifter of the transparent film has been described in the case using the SOG but may be exemplified by indium oxide, silicon dioxide, silicon nitride, magnesium fluoride or polymethyl methacrylate. The indium oxide is sputtered to deposit a transparent thin film. This thin film can also be made of silicon dioxide by the CVD method.

On the other hand, the integrated circuit pattern may be formed of the phase shift pattern of the aforementioned second mask. In this case, the first mask corresponding to the second mask is formed into the transparent substrate so that the integrated circuit pattern is formed in its peripheral portion with the mask blinding shielding region and the positioning mark.

The effects to be obtained from the representatives of the invention disclosed herein will be briefly described in the following.

In a method of irradiating an object with a light having transmitted through a transmissive region of a mask which is formed with a pattern having a shielding region and the transmissive region, the mask is exposed such that a first mask and a second mask are overlapped. The contrast of the projected image can be drastically improved by establishing an optical phase difference in the transmission light of the first mask through the second mask as in case one mask is formed thereover with a pattern having a shielding region and a transmissive region and with an optical phase shifter in a portion of the transmissive region.

Thus, the transfer accuracy of the mask pattern can be improved.

The manufacture can be facilitated because the mask formed with the pattern for the phase shifter is separated from the mask formed with the pattern having the shielding region and the transmissive region.

Moreover, foreign substances can be shielded by overlapping the mask formed with the pattern For the phase shifter and the mask formed with the pattern having the shielding region and the transmissive region such that their principal surfaces face each other, and by sealing the overlapped mask around the glass substrate.

What is claimed is:

1. In an exposure method by which a wafer is irradiated with light transmitted through a phase shifting mask formed with a mask pattern corresponding to a circuit pattern having a shielding region and a transmission region, to transfer the circuit pattern of said mask to said wafer, wherein the improvement resides: in that said mask includes a first mask member and a second mask member; in that a first pattern having a light shielding region and a transparent region is formed on a principal surface of a first transparent mask substrate of the first mask member; in that a principal surface of a second transparent mask substrate of the second mask member is provided with a second pattern having a phase shifter for introducing a phase difference in a portion of light transmitted through the first mask member; and in that said first and second transparent mask substrates are superposed relative to one another such that their principal surfaces are in close proximity or in contact with each other, so that a clear image may be focused on said wafer by making use of interference of light transmitted through the first and second mask members.

2. An exposure method according to claim 1, wherein each of the first and second transparent mask substrates has a back surface opposite the principal surface, and wherein focusing of the clear image is performed such that foreign substances on the back surfaces are defocused and an image thereof prevented from being transferred to the wafer.

3. An exposure method according to claim 1, wherein the second pattern is formed on the principal surface of the second transparent mask substrate.

4. An exposure method according to claim 1, wherein the second pattern is a recess formed in the principal surface of the second transparent mask substrate.

5. An exposure method according to claim 1, wherein each of the first and second transparent mask substrates has peripheral regions, and said peripheral regions of the first and second transparent mask substrates are sealed to each other.

6. A method of making semiconductor devices, comprising the steps of: (1) irradiating an ultraviolet or deep ultraviolet monochromatic exposure light beam, having a substantially constant wavelength and being coherent or partially coherent, onto a phase shifting mask on which enlarged circuit patterns are formed, and (2) reducing and projecting a real image of the enlarged circuit patterns with the exposure light beam passing through the mask, by a reducing lens system having a predetermined numerical aperture, so that the real image can be formed onto a photosensitive resist film on a major surface of a wafer, whereby reduced circuit patterns corresponding to the enlarged circuit patterns on the mask are transferred onto the wafer, said mask comprising:

(a) a first transparent mask substrate having a light shielding region on a major surface thereof and first and second opening regions corresponding to the enlarged circuit patterns, disposed in the light shielding region; and (b) a second transparent mask substrate having a major surface, superposed to the first transparent mask substrate such that the major surfaces of the first and second transparent mask substrates are in close proximity or in contact with each other, said second transparent mask substrate having a phase shifting region, which phase shifting region covers the second opening region, for inverting a phase of a transmitted exposure light beam transmitted through the second opening region as compared with a phase of transmitted exposure light beam transmitted through the first opening region which the phase shifting region does not cover, and thereby clearly forming the real image of the enlarged circuit patterns onto the photosensitive resist film on the major surface of the wafer owing to interference between transmitted exposure light beam transmitted through the phase shifting mask.

7. A method of making semiconductor devices according to claim 6, wherein the first and second opening regions are spaced from each other only by the light shielding region.

8. A method of making semiconductor devices according to claim 6, wherein the phase shifting region is disposed on the major surface of the second transparent mask substrate.

9. A method of making semiconductor devices according to claim 6, wherein the phase shifting region is disposed in the major surface of the second transparent mask substrate.

10. A method of making semiconductor devices, comprising the steps of: (1) irradiating an ultraviolet or deep ultraviolet monochromatic exposure light beam, having a substantially constant wavelength and being coherent or partially coherent, onto a phase shifting mask on which enlarged circuit patterns are formed, and (2) reducing and projecting a real image of the enlarged circuit patterns with the exposure light beam passing through the mask, by a reducing lens system having a predetermined numerical aperture, so that the real image can be formed onto a photosensitive resist film on a major surface of a wafer, whereby reduced circuit patterns corresponding to the enlarged circuit patterns on the mask are transferred onto the wafer, said mask comprising:

(a) a light shielding layer having first and second opening regions, corresponding to the enlarged circuit patterns; and (b) a transparent mask substrate having a major surface, the transparent mask substrate being superposed to the light shielding layer such that the major surface of the transparent mask substrate and the light shielding layer are in close proximity or in contact with each other, the transparent mask substrate having a phase shifting region, which phase shifting region entirely covers the second opening region and extends beyond a boundary of the second opening region, for inverting a phase of a transmitted exposure light beam transmitted through the second opening region as compared with a phase of a transmitted exposure light beam transmitted through the first opening region which the phase shifting region does not cover, and thereby clearly forming the real image of the enlarged circuit patterns onto the photosensitive resist film on the major surface of the wafer owing to interference between transmitted exposure light beams transmitted through the phase shifting mask.

11. A method of making semiconductor devices according to claim 10, wherein the phase shifting region is a phase shifting recess region disposed in the major surface of the transparent mask substrate.

12. A method of making semiconductor devices, comprising the steps of: (1) irradiating an ultraviolet or deep ultraviolet exposure light beam, having a substantially constant wavelength and being coherent or partially coherent, onto a phase shifting mask on which enlarged circuit patterns are formed, and (2) reducing and projecting a real image of the enlarged circuit patterns with the exposure light beam passing through the mask, by a reducing lens system having a predetermined numerical aperture, so that the real image can be formed onto a photosensitive resist film on a major surface of a wafer, whereby reduced circuit patterns corresponding to the enlarged circuit patterns on the mask are transferred onto the wafer, said mask comprising:

(a) a first transparent mask substrate having a light shielding region on a major surface thereof and first and second opening regions corresponding to the enlarged circuit patterns, disposed in the light shielding region; and (b) a second transparent mask substrate having a major surface, superposed to the first transparent mask substrate such that the major surfaces of the first and second transparent mask substrates are in close proximity or in contact with each other, said second transparent mask substrate having a phase shifting region, which phase shifting region covers the second opening region, for inverting a phase of a transmitted exposure light beam transmitted through the second opening region as compared with a phase of transmitted exposure light beam transmitted through the first opening region which the phase shifting region does not cover, and thereby clearly forming the real image of the enlarged circuit patterns onto the photosensitive resist film on the major surface of the wafer owing to interference between transmitted exposure light beam transmitted through the phase shifting mask.

13. A method of making semiconductor devices, comprising the steps of: (1) irradiating an ultraviolet or deep ultraviolet exposure light beam, having a substantially constant wavelength and being coherent or partially coherent, onto a phase shifting mask on which enlarged circuit patterns are formed, and (2) reducing and projecting a real image of the enlarged circuit patterns with the exposure light beam passing through the mask, by a reducing lens system having a predetermined numerical aperture, so that the real image can be formed onto a photosensitive resist film on a major surface of a wafer, whereby reduced circuit patterns corresponding to the enlarged circuit patterns on the mask are transferred onto the wafer, said mask comprising:

(a) a light shielding layer having first and second opening regions, corresponding to the enlarged circuit patterns; and (b) a transparent mask substrate having a major surface, the transparent mask substrate being superposed to the light shielding layer such that the major surface of the transparent mask substrate and the light shielding layer are in close proximity or in contact with each other, the transparent mask substrate having a phase shifting region, which phase shifting region entirely covers the second opening region and extends beyond a boundary of the second opening region, for inverting a phase of a transmitted exposure light beam transmitted through the second opening region as compared with a phase of a transmitted exposure light beam transmitted through the first opening region which the phase shifting region does not cover, and thereby clearly forming the real image of the enlarged circuit patterns onto the photosensitive resist film on the major surface of the wafer owing to interference between transmitted exposure light beams transmitted through the phase shifting mask.

* * * * *